(12) United States Patent
Little et al.

(10) Patent No.: US 10,164,362 B2
(45) Date of Patent: Dec. 25, 2018

(54) PLUG CONNECETOR WITH A METALLIC ENCLOSURE HAVING HEAT SINK MEMBER THEREON

(71) Applicant: FOXCONN INTERCONNECT TECHNOLOGY LIMITED, Grand Cayman (KY)

(72) Inventors: Terrance F. Little, Fullerton, CA (US); An-Jen Yang, Irvine, CA (US); Jim Zhao, Irvine, CA (US); Yuan Zhang, Rowland-Heights-CA, CA (US); Jie Zheng, Rowland-Heights, CA (US); Ke-Hao Chen, New Taipei (TW); Yu Zhang, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/395,652

(22) Filed: Dec. 30, 2016

(65) Prior Publication Data
US 2017/0194751 A1 Jul. 6, 2017

Related U.S. Application Data

(60) Provisional application No. 62/273,456, filed on Dec. 31, 2015, provisional application No. 62/318,779, (Continued)

(51) Int. Cl.
*G02B 6/42* (2006.01)
*H05K 7/20* (2006.01)
(Continued)

(52) U.S. Cl.
CPC ......... *H01R 12/721* (2013.01); *G02B 6/4269* (2013.01); *H01L 23/467* (2013.01);
(Continued)

(58) Field of Classification Search
CPC ........... G02B 6/4268–6/4269; H05K 7/20409; H01L 23/467; H01R 23/02
See application file for complete search history.

(56) References Cited

U.S. PATENT DOCUMENTS 4,771,365 A * 9/1988 Cichocki .............. H05K 7/1421
165/80.3
6,607,400 B1 * 8/2003 Ko ......................... H01R 24/50
439/578
(Continued)

FOREIGN PATENT DOCUMENTS

WO 2015148786 1/2015

*Primary Examiner* — Robert J Hoffberg
(74) *Attorney, Agent, or Firm* — Wei Te Chung; Ming Chieh Chang

(57) ABSTRACT

A plug connector includes a metallic enclosure with a heat sink member exposed on an exterior surface to enclose a printed circuit board; a set of electronic components assembled upon the printed circuit board; a thermal pad sandwiched between the set of electronic components and the metallic enclosure to dissipate heat from the electronic component to the metallic enclosure and eventually to the air via the heat sink member; wherein a center of said heat sink member is essentially aligned with a center of said set of electronic components or a center of the thermal pad for efficient dissipation of heat.

7 Claims, 52 Drawing Sheets

Related U.S. Application Data filed on Apr. 6, 2016, provisional application No. 62/367,098, filed on Jul. 26, 2016.

(51) Int. Cl.
  *H01R 24/00* (2011.01)
  *H01R 12/72* (2011.01)
  *H01L 23/467* (2006.01)
  *H05K 5/00* (2006.01)
  *H01R 13/66* (2006.01)

(52) U.S. Cl.
  CPC .......... *H01R 23/02* (2013.01); *H05K 5/0047* (2013.01); *H05K 7/20409* (2013.01); *H05K 7/20436* (2013.01); *H05K 7/20445* (2013.01); *H01R 13/6658* (2013.01)

(56) References Cited

U.S. PATENT DOCUMENTS

| | | | |
|---|---|---|---|
| 6,634,891 B1 | 10/2003 | Cheng | |
| 6,811,326 B2 * | 11/2004 | Keeble | G02B 6/4201 385/92 |
| 7,099,591 B2 * | 8/2006 | Goel | G02B 6/4201 359/882 |
| 8,134,836 B2 * | 3/2012 | Tsai | H01L 23/3675 165/80.3 |
| 8,469,609 B2 * | 6/2013 | Ishii | G02B 6/4201 385/53 |
| 8,672,562 B2 * | 3/2014 | Ishii | G02B 6/4201 385/88 |
| 9,345,128 B2 * | 5/2016 | Regnier | H01R 13/6469 |
| 9,480,189 B2 * | 10/2016 | Kawai | H05K 1/0203 |
| 2009/0103267 A1 * | 4/2009 | Wieland | H05K 7/20409 361/707 |
| 2012/0282807 A1 * | 11/2012 | Regnier | H01R 13/6469 439/607.01 |
| 2016/0149324 A1 | 5/2016 | Molex | |
| 2016/0211620 A1 | 7/2016 | Sharf et al. | |
| 2017/0133777 A1 * | 5/2017 | Little | H01R 24/60 |
| 2017/0303441 A1 * | 10/2017 | Farshchian | H05K 7/20327 |

* cited by examiner

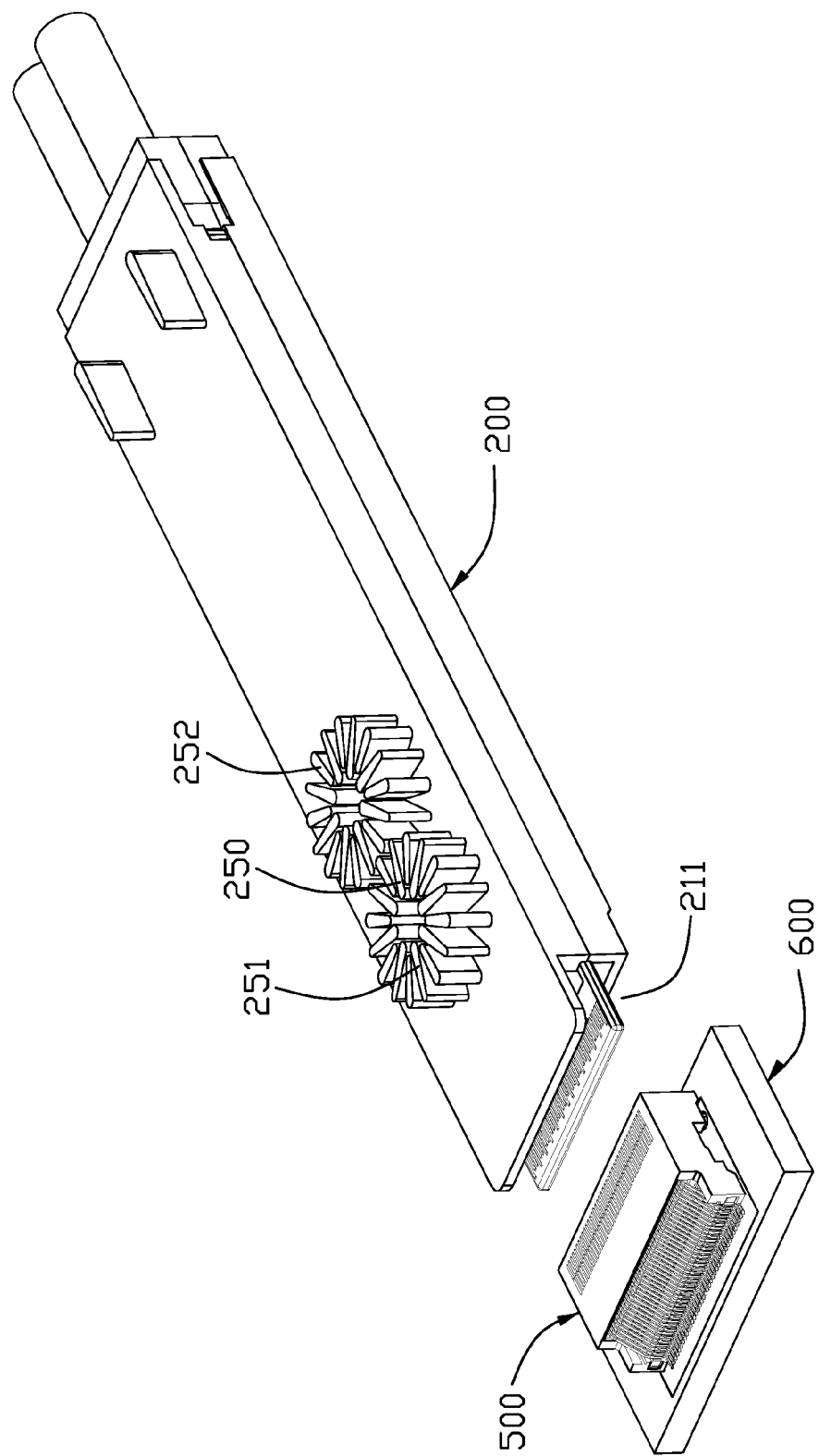

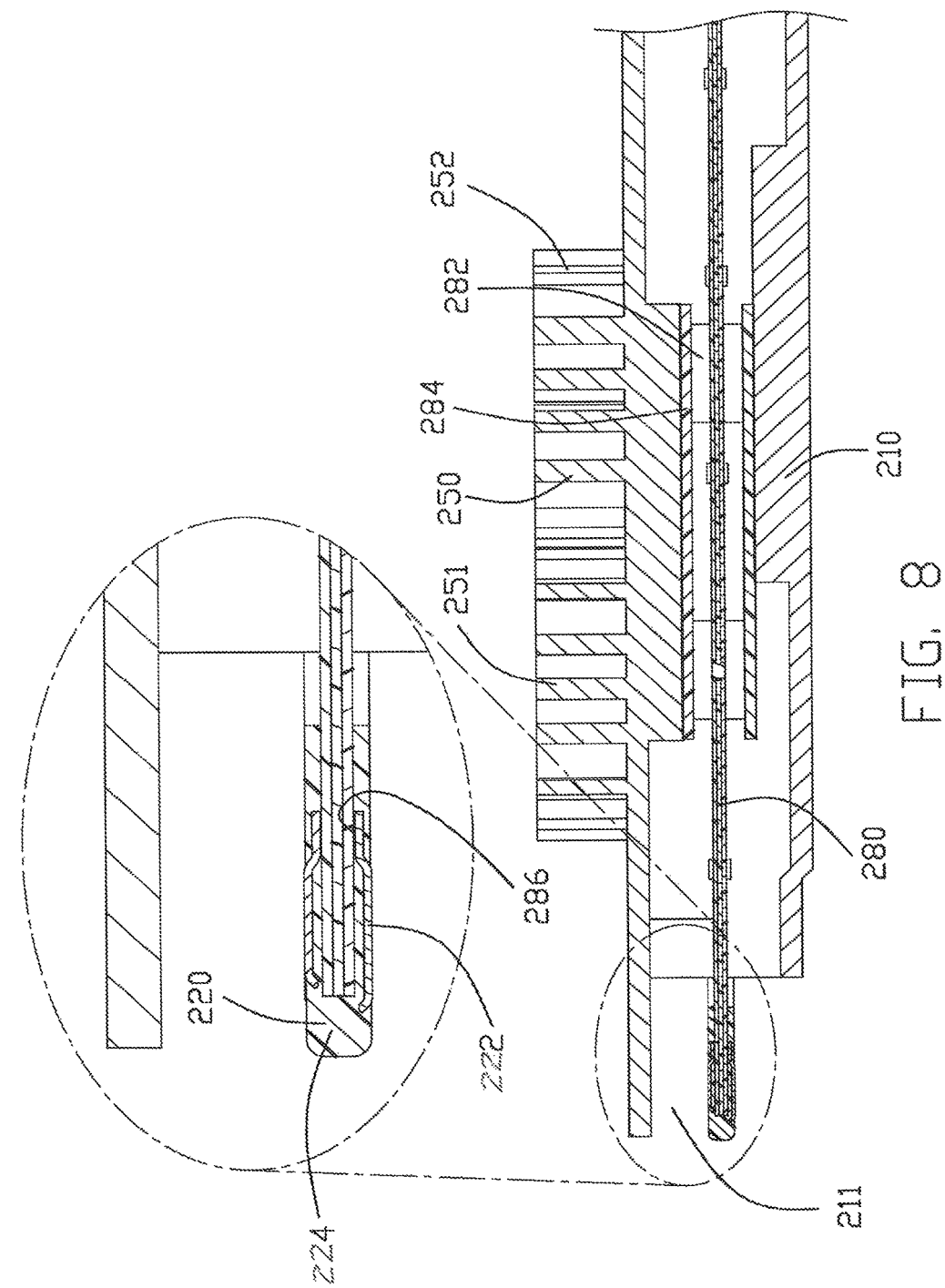

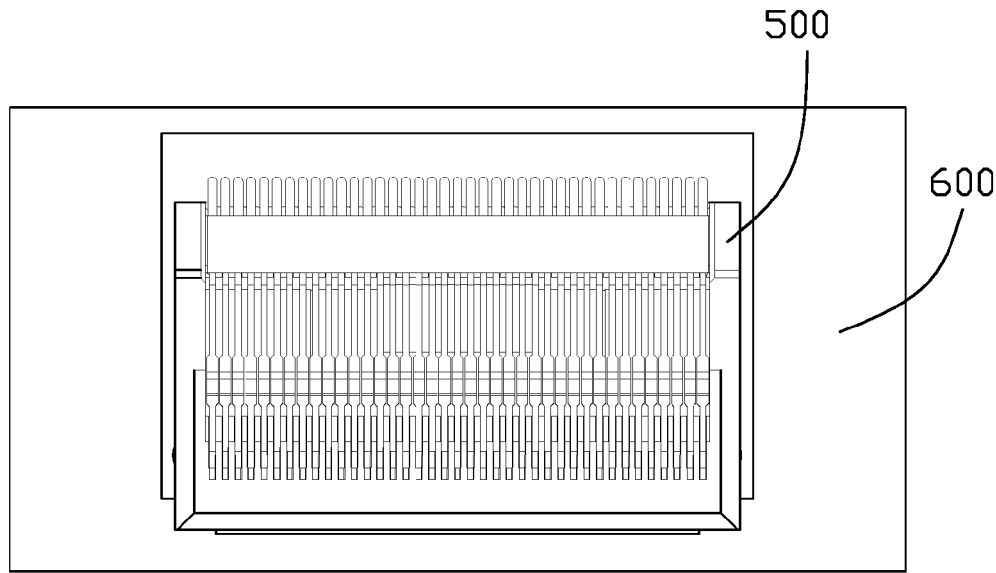
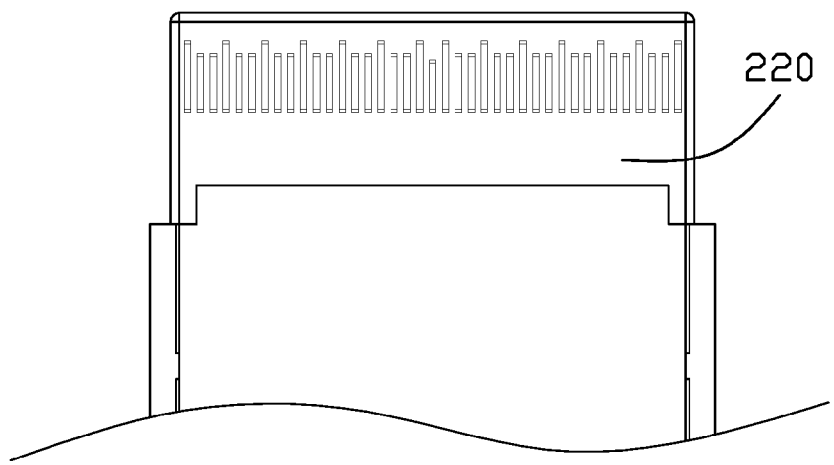
FIG. 12

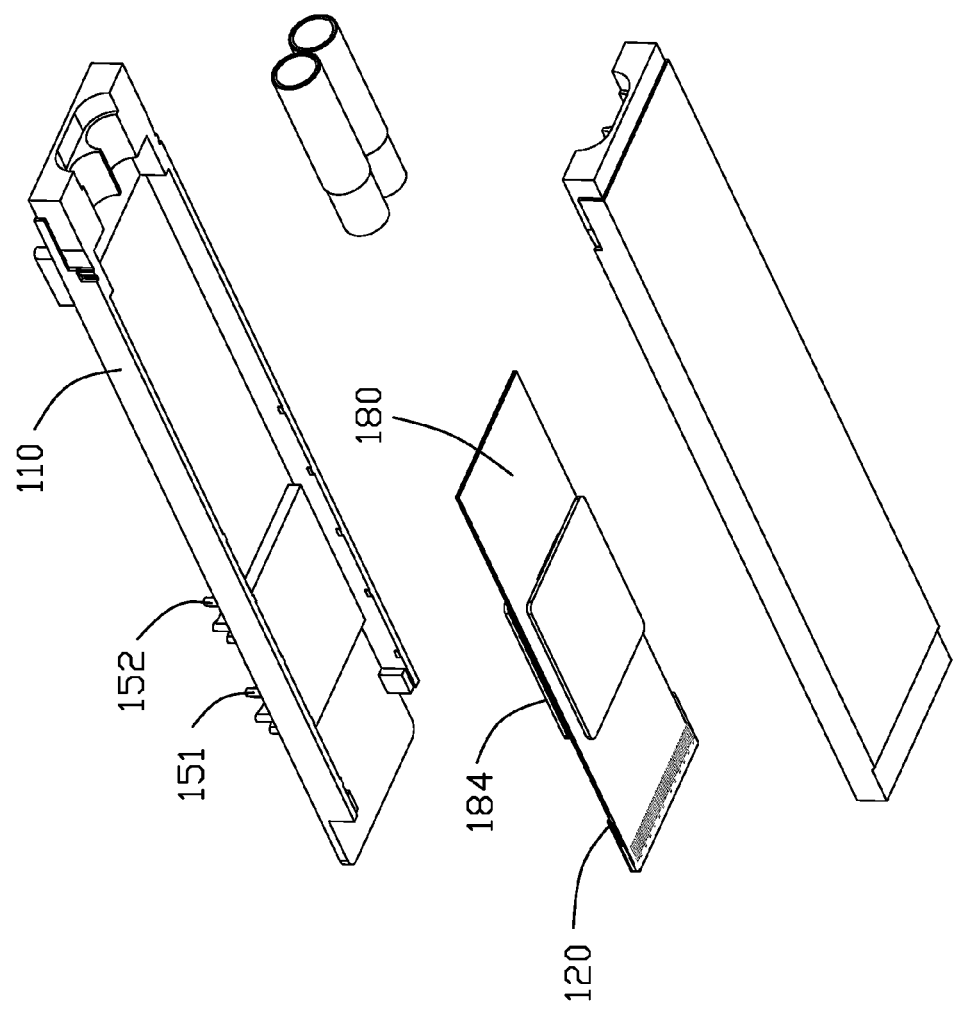

US 10,164,362 B2

PLUG CONNECETOR WITH A METALLIC ENCLOSURE HAVING HEAT SINK MEMBER THEREON

BACKGROUND OF THE INVENTION

1. Field of the Invention

The invention relates to a plug connectors, and particularly to the plug connector with a heat sink structure.

2. Description of Related Art

U.S. Publication No. US20160149324, published to Regnier on May 26, 2016, discloses a plug conneter to be mated with a receptacle connector. The plug connector comprises a metal shell, and a printed circuit board received in the metal shell. The metal shell comprises a unitarily formed heat sink thereon to be mated with the receptacle connector. Anyhow, the unitary structure on the shell may be not beneficial for manufacturing, or may occupy too much surface of the metal shell.

An improved plug connector is desired to offer advantages over the related art.

SUMMARY OF THE INVENTION

An object of the present invention is to provide a plug connector having good heat dissipation performance.

To achieve the above-mentioned object, a plug connector comprises a metallic enclosure with a heat sink member exposed on an exterior surface to enclose a printed circuit board; a set of electronic components assembled upon the printed circuit board; a thermal pad sandwiched between the set of electronic components and the metallic enclosure to dissipate heat from the electronic component to the metallic enclosure and eventually to the air via the heat sink member; wherein a center of said heat sink member is essentially aligned with a center of said set of electronic components or a center of the thermal pad for efficient dissipation of heat.

The present invention secondly provides a plug connector comprises a metallic enclosure with a heat sink member exposed on an exterior surface to enclose a printed circuit board; a set of electronic components assembled upon the printed circuit board; a thermal pad sandwiched between the set of electronic components and the metallic enclosure to dissipate heat from the electronic component to the metallic enclosure and eventually to the air via the heat sink member; wherein the heat sink member is detachably attached upon the metallic enclosure.

According to the present invention, a thermal pad sandwiched between the set of electronic components and the metallic enclosure to dissipate heat from the electronic component to the metallic enclosure and eventually to the air via the heat sink member, therefore, the plug connector having good heat dissipation performance.

BRIEF DESCRIPTION OF THE DRAWINGS

FIG. 1 shows a first embodiment of a plug connector adapted to be mated with a receptacle connector in accordance with present invention;

FIG. 8 is a cross-sectional view of a portion of the plug connector of FIG. 1;

FIG. 12 is a top view of the plug connector and the receptacle connector on the printed circuit board of FIG. 1;

FIG. 16(A) is a rear upward exploded view of the plug connector of FIG. 14;

DETAILED DESCRIPTION OF THE PREFERRED EMBODIMENT

Figure 2A:
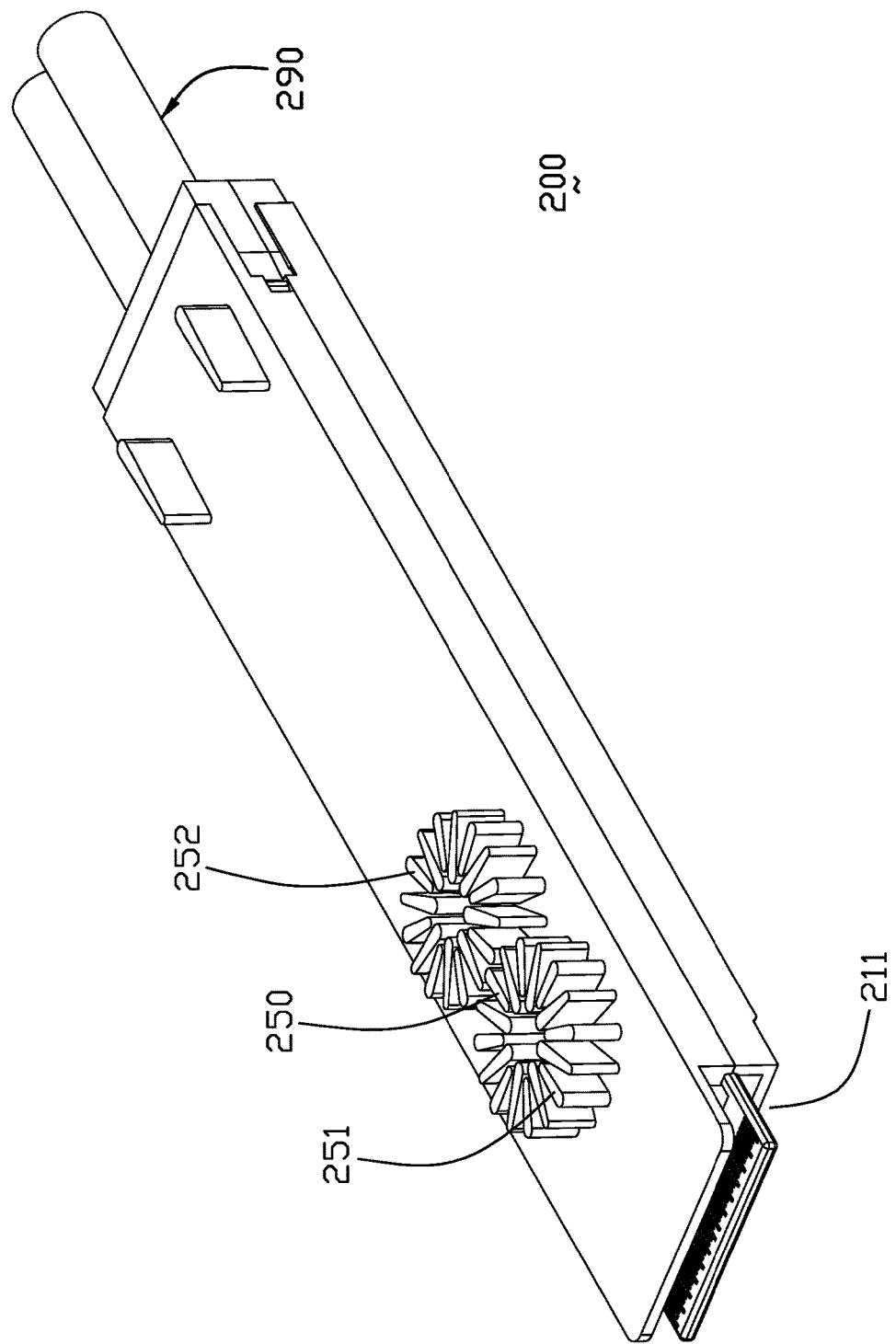
FIG. 2(A) is a front downward perspective view of the plug connector of FIG. 1.
Figure 2B:
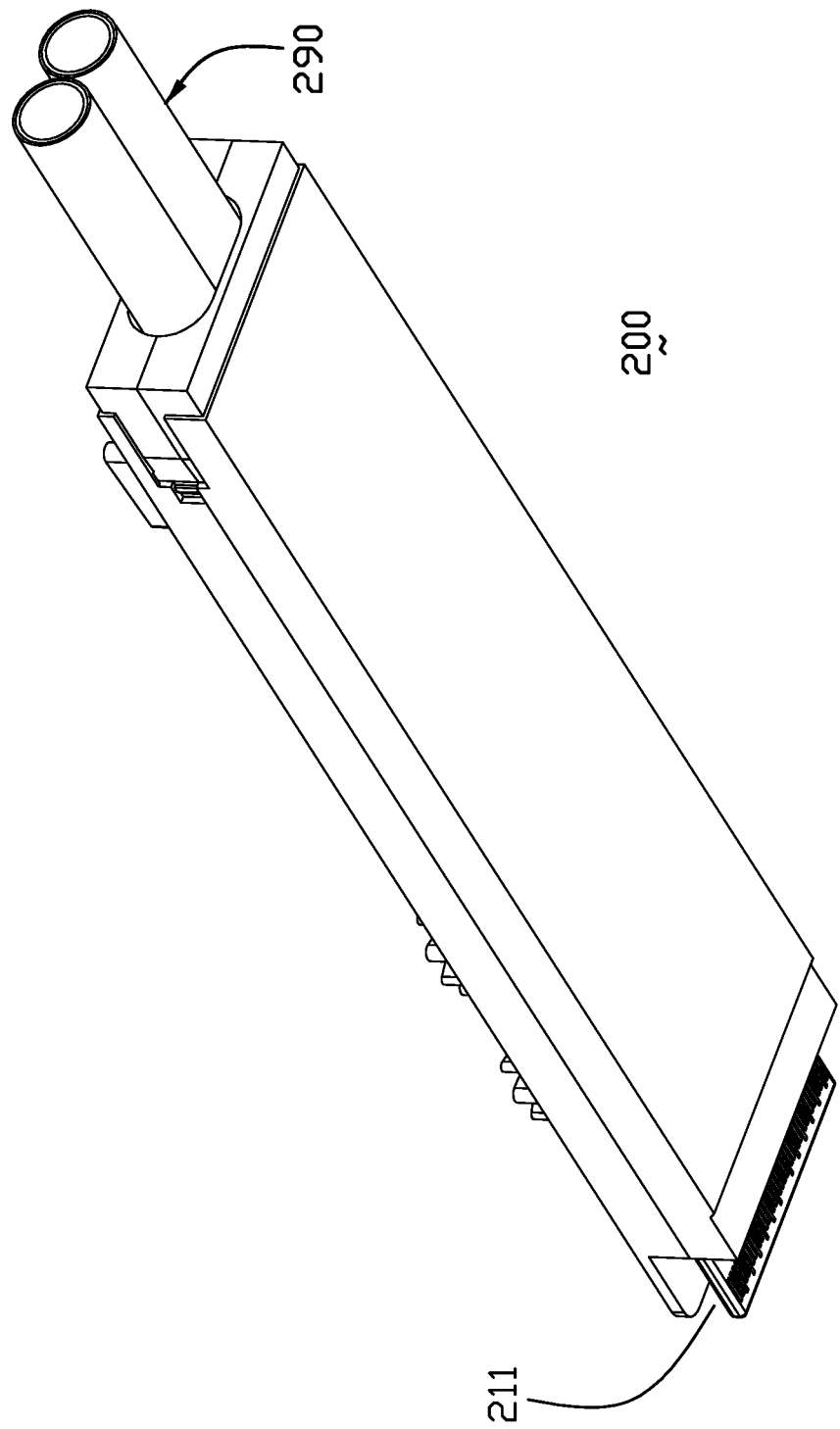
FIG. 2(B) is a rear upward perspective view of the plug connector of FIG. 1.
Figure 3:
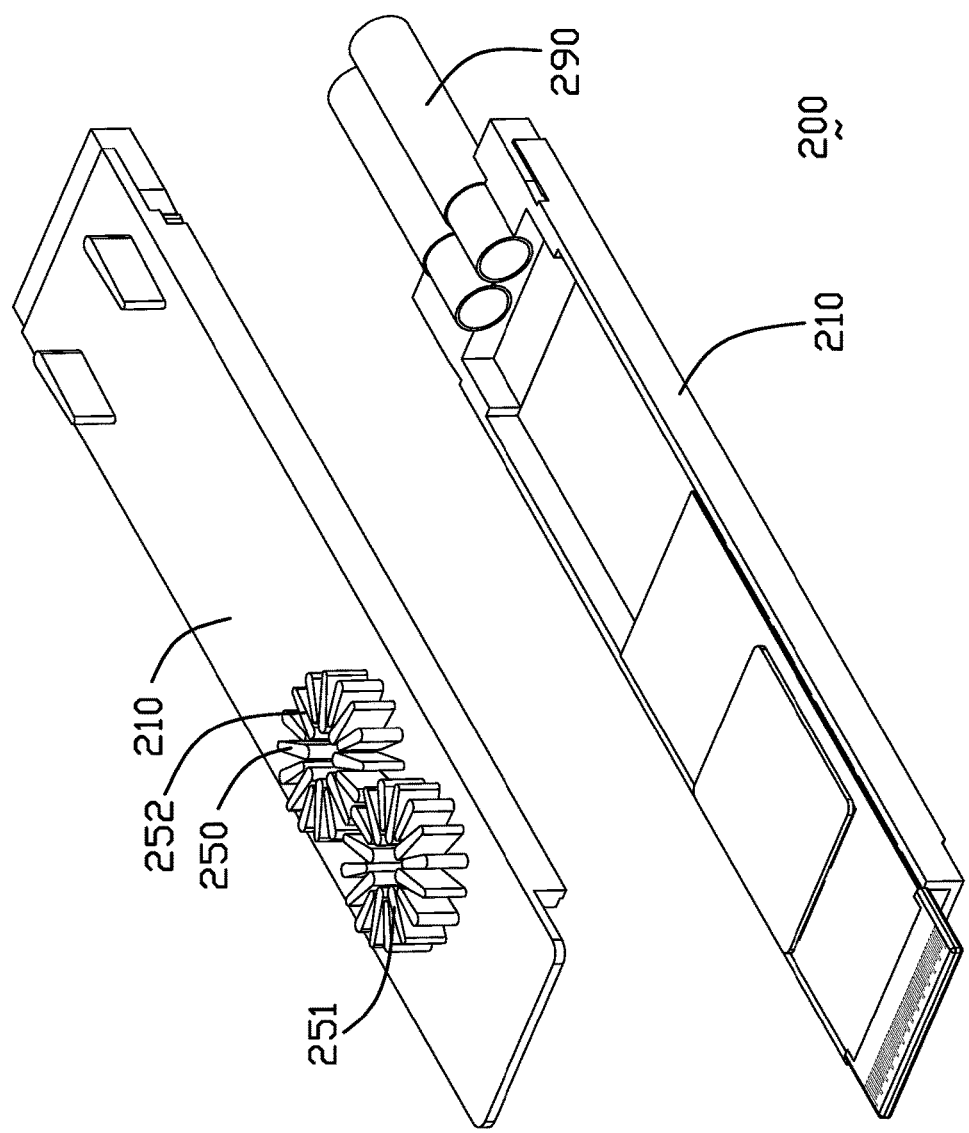
FIG. 3 is an exploded perspective view of the plug connector of FIG. 1.
Figure 4A:
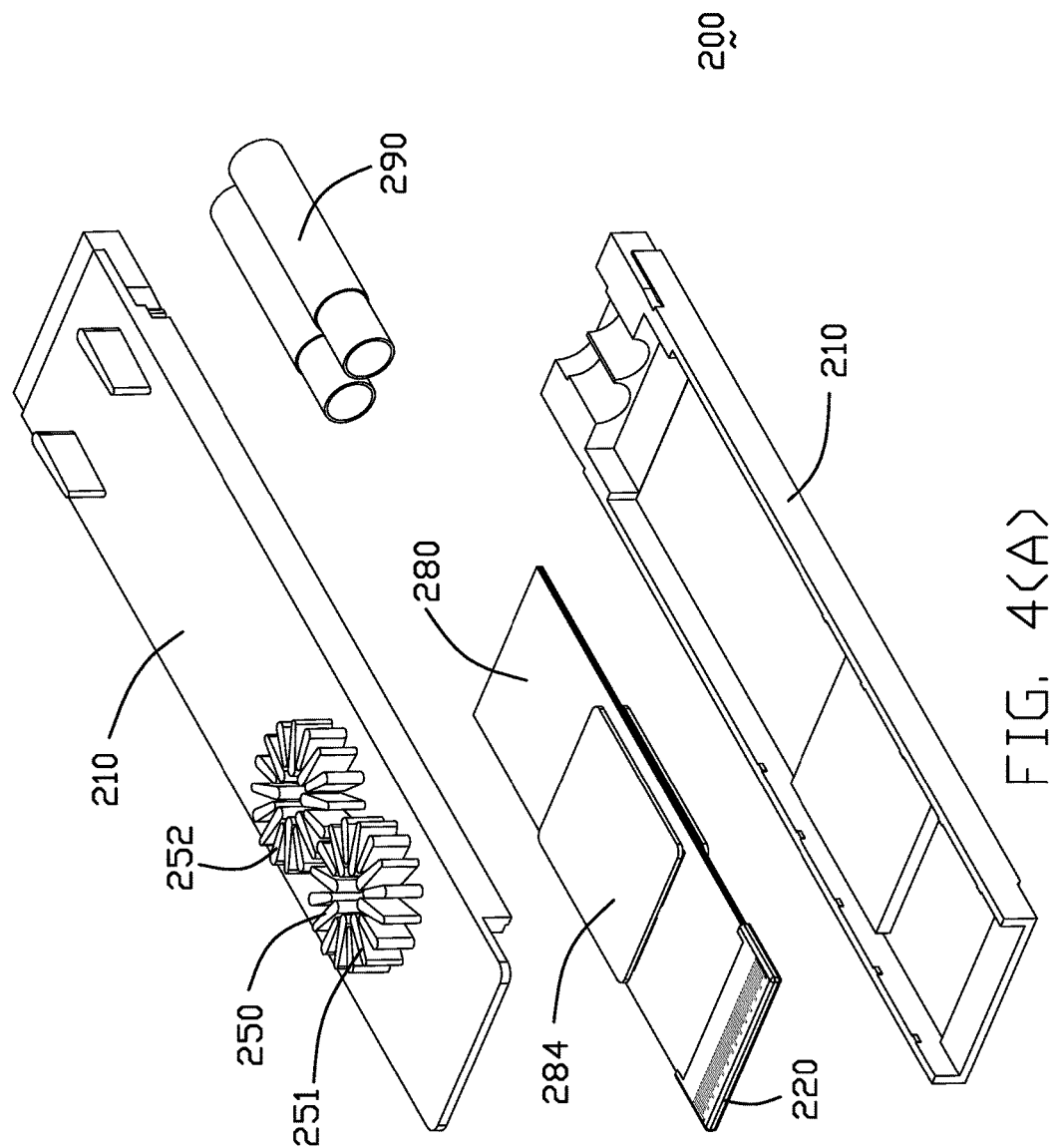
FIG. 4(A) is a further exploded perspective view of the plug connector of FIG. 3.
Figure 4B:
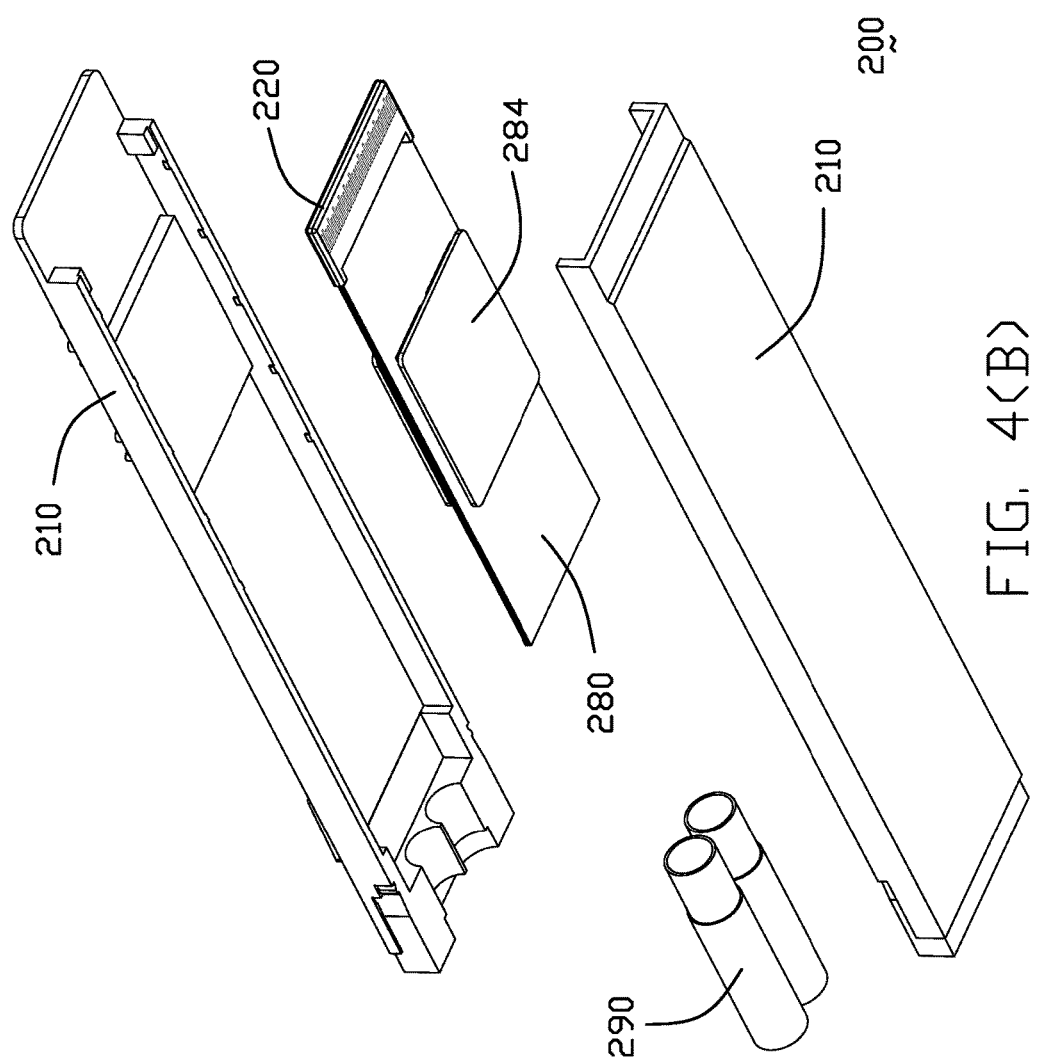
FIG. 4(B) is another further exploded perspective view of the plug connector of FIG. 3.
Figure 5A:
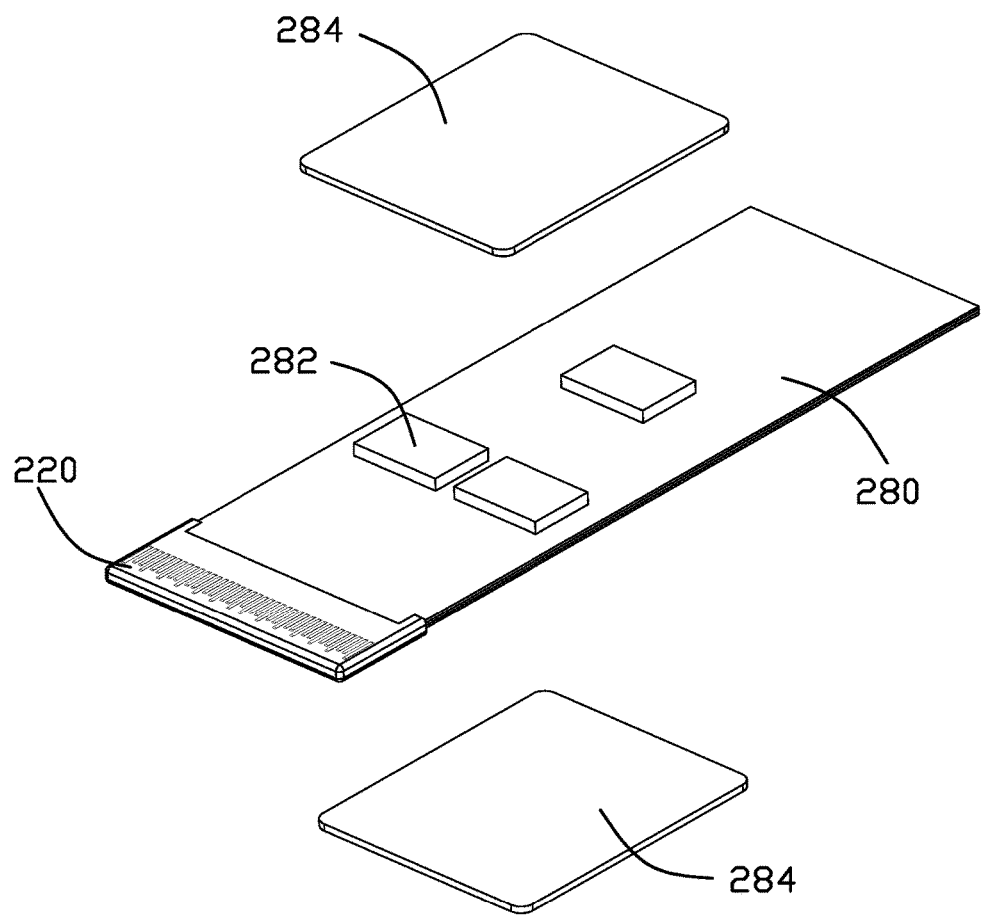
FIG. 5(A) is an exploded perspective view of a portion of the plug connector of FIG. 3.
Figure 5B:
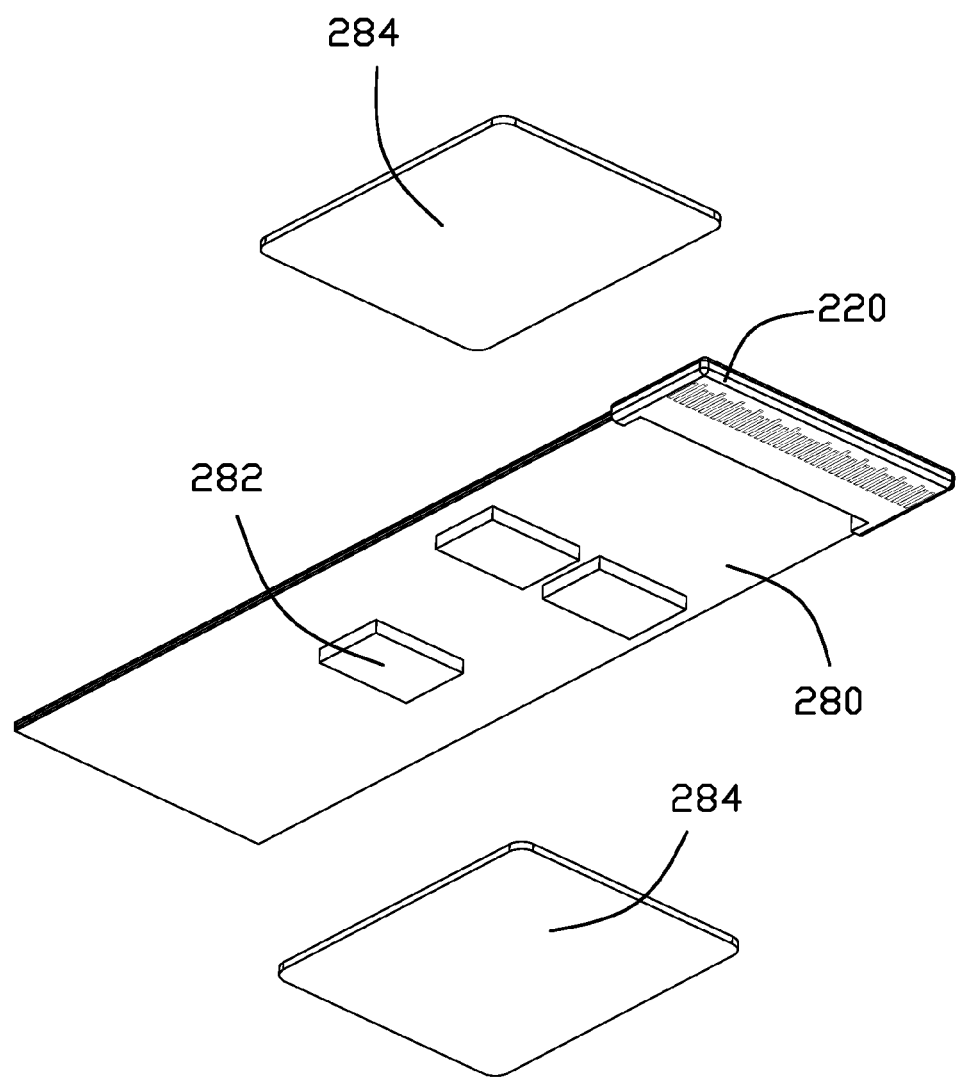
FIG. 5(B) is another further exploded perspective view of the portion of the plug conneter of FIG. 3.
Figure 6A:
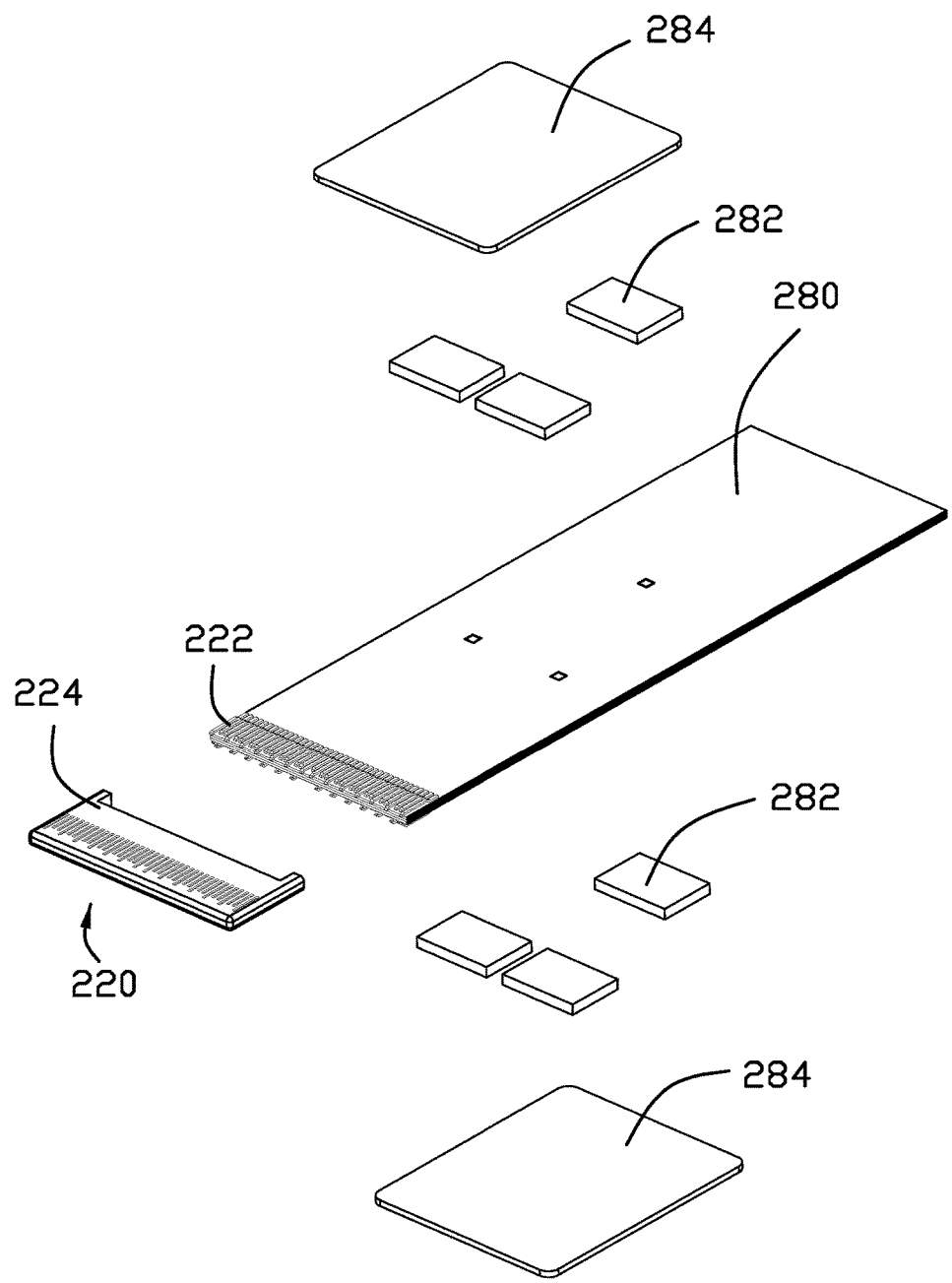
FIG. 6(A) is a further exploded perspective view of the portion of the plug connector of FIG. 5(A)
Figure 6B:
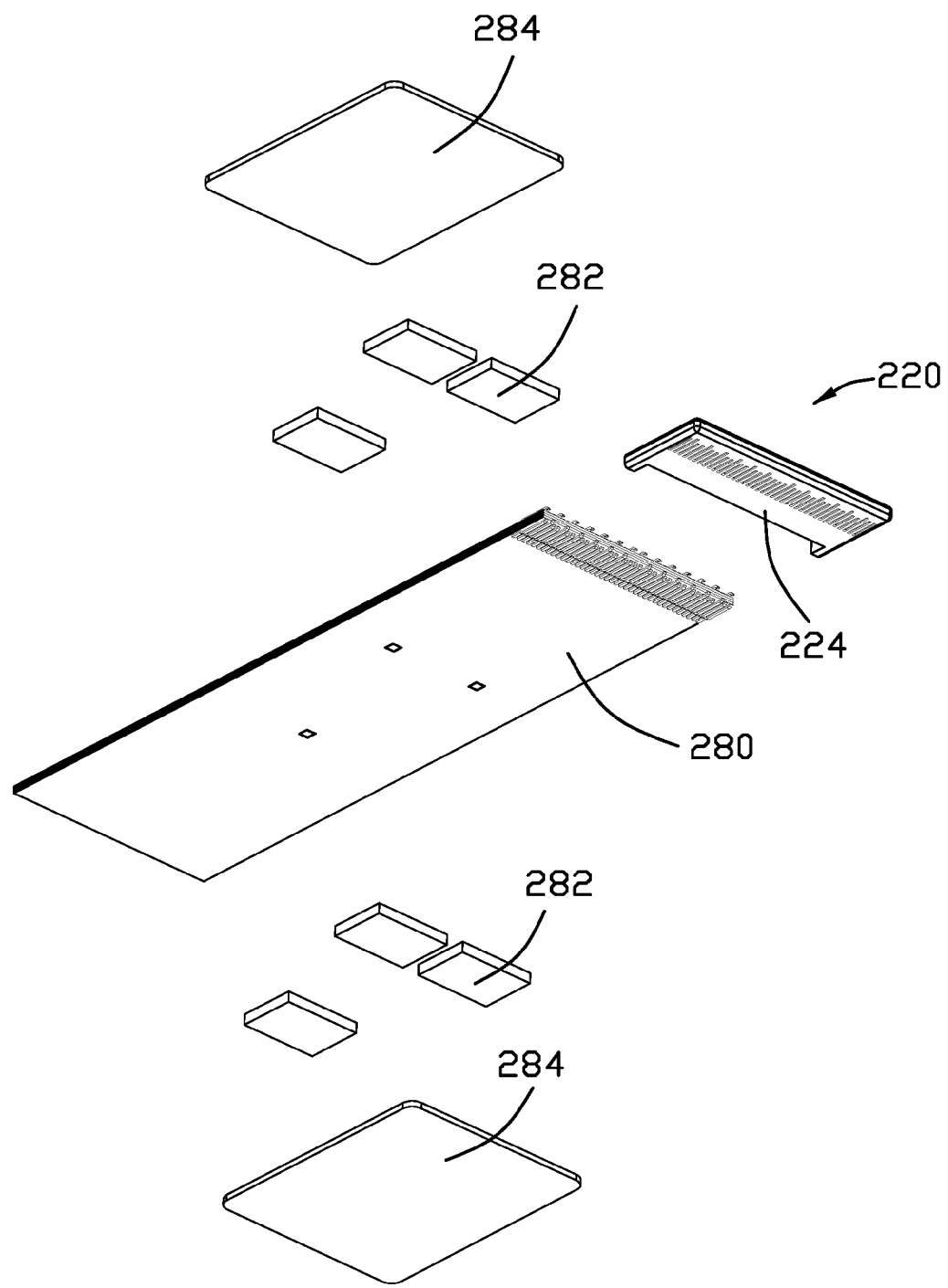
FIG. 6(B) is another further exploded perspective view of the portion of the plug conneter of FIG. 5(B)
Figure 7A:
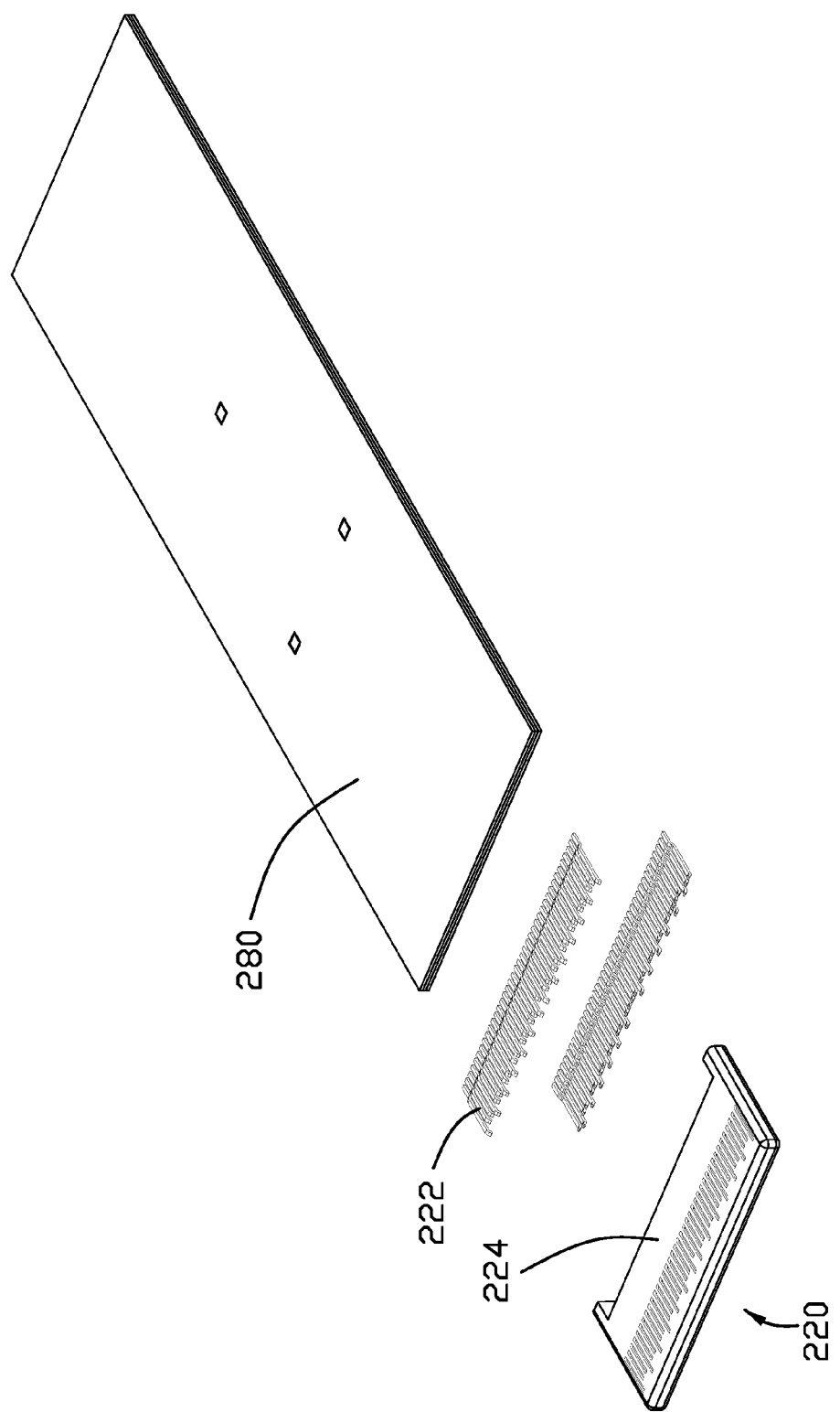
FIG. 7(A) is a further exploded perspective view of a portion of the plug connector of FIG. 6(A)
Figure 7B:
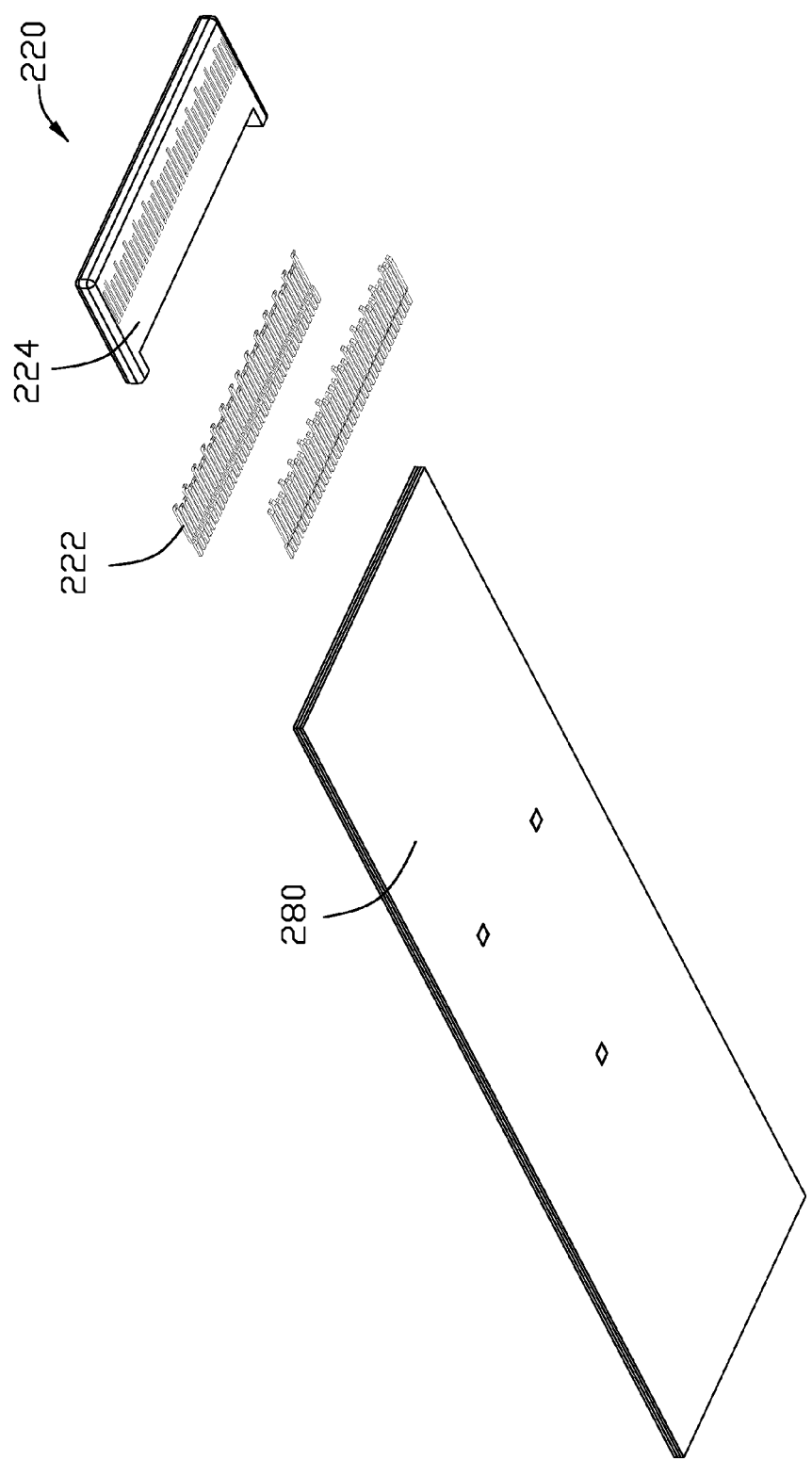
FIG. 7(B) is another further exploded perspective view of the portion of the plug connector of FIG. 6(B)
Figure 9A:
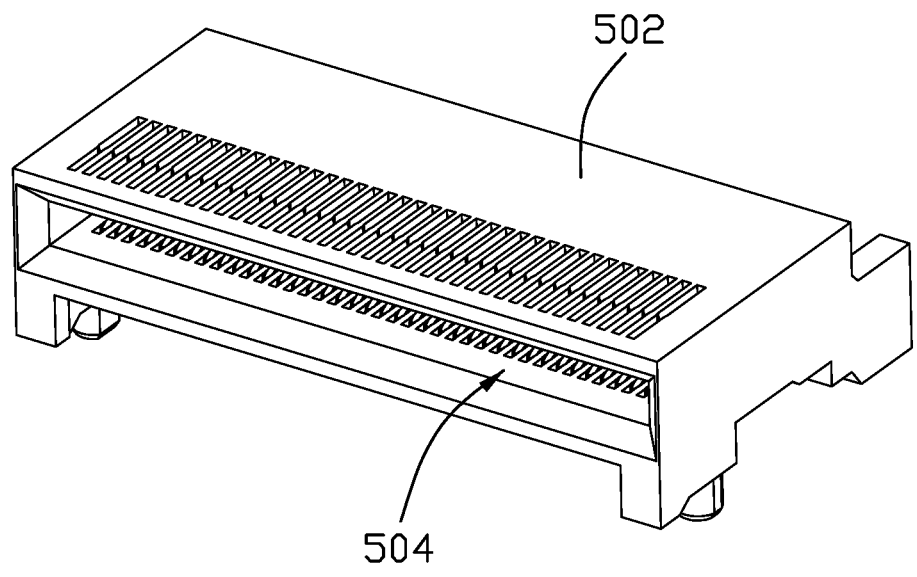
FIG. 9(A) is a front perspective view of the receptacle connector of FIG. 1.
Figure 9B:
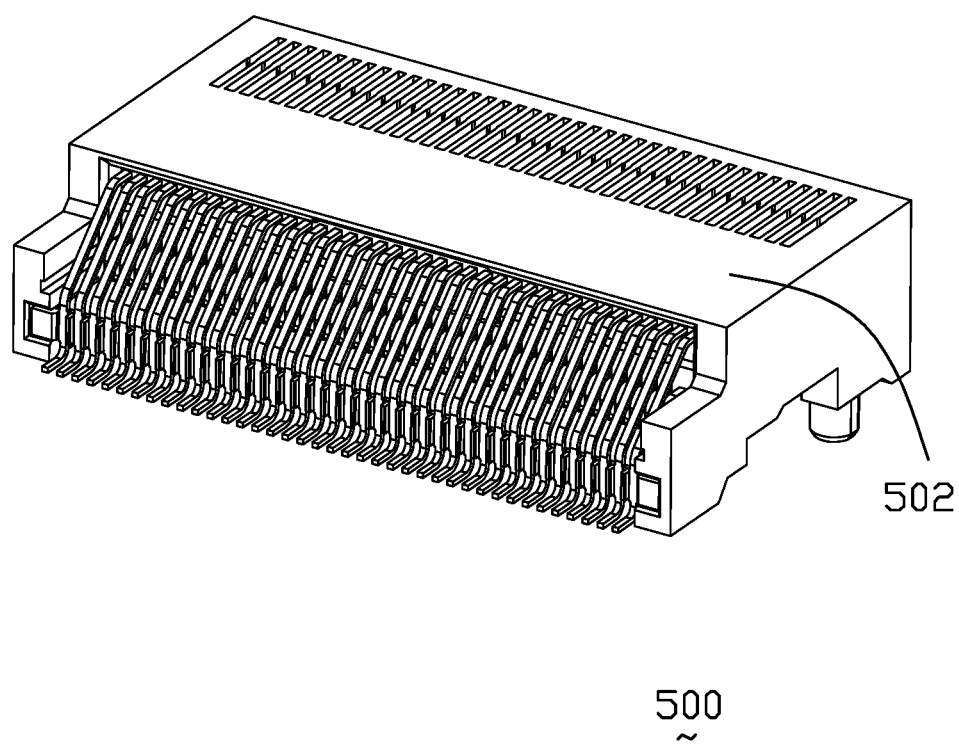
FIG. 9(B) is a rear exploded perspective view of the receptacle connector of FIG. 1.
Figure 10A:
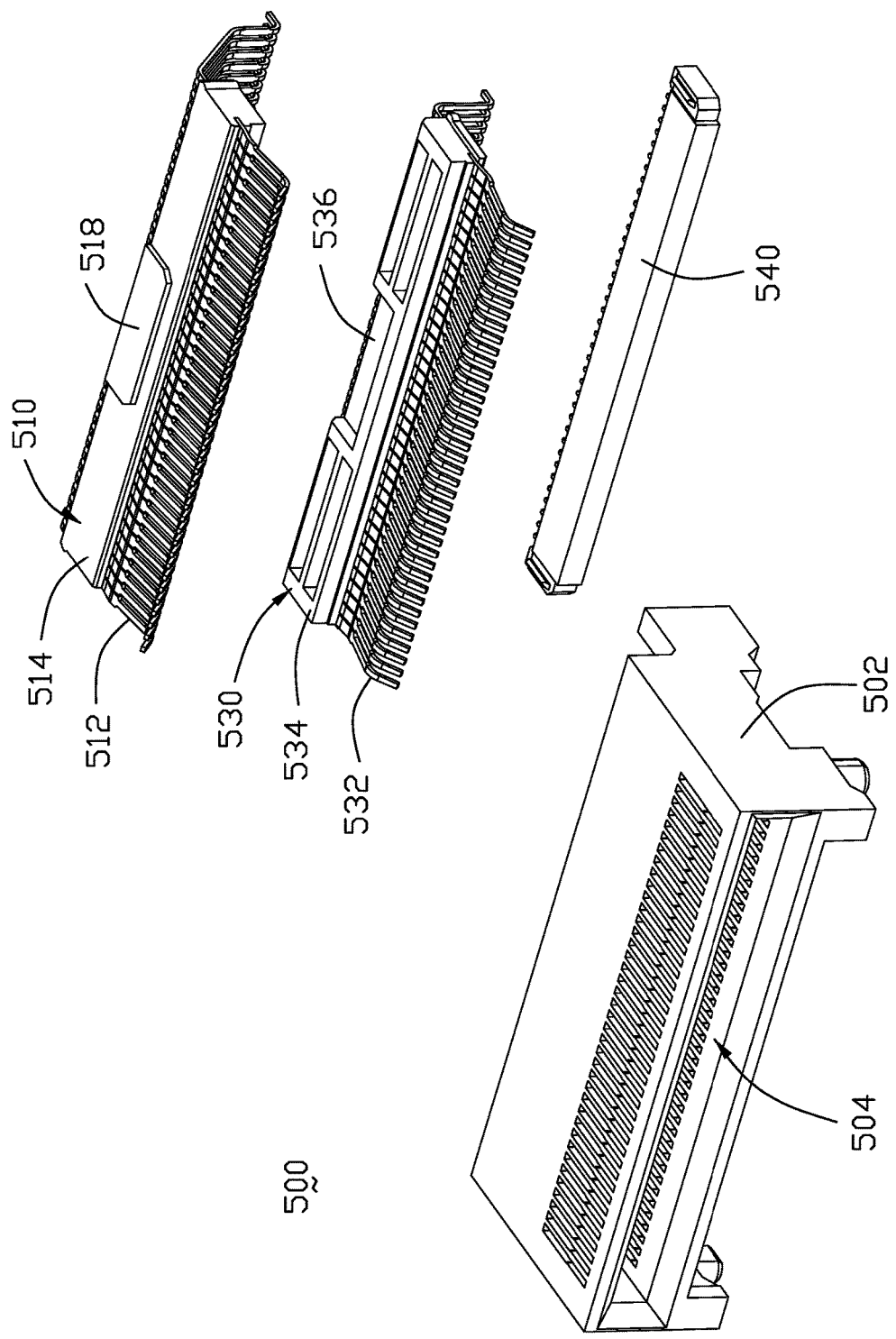
FIG. 10(A) is a further front exploded perspective view of the receptacle connector of FIG. 9(A)
Figure 10B:
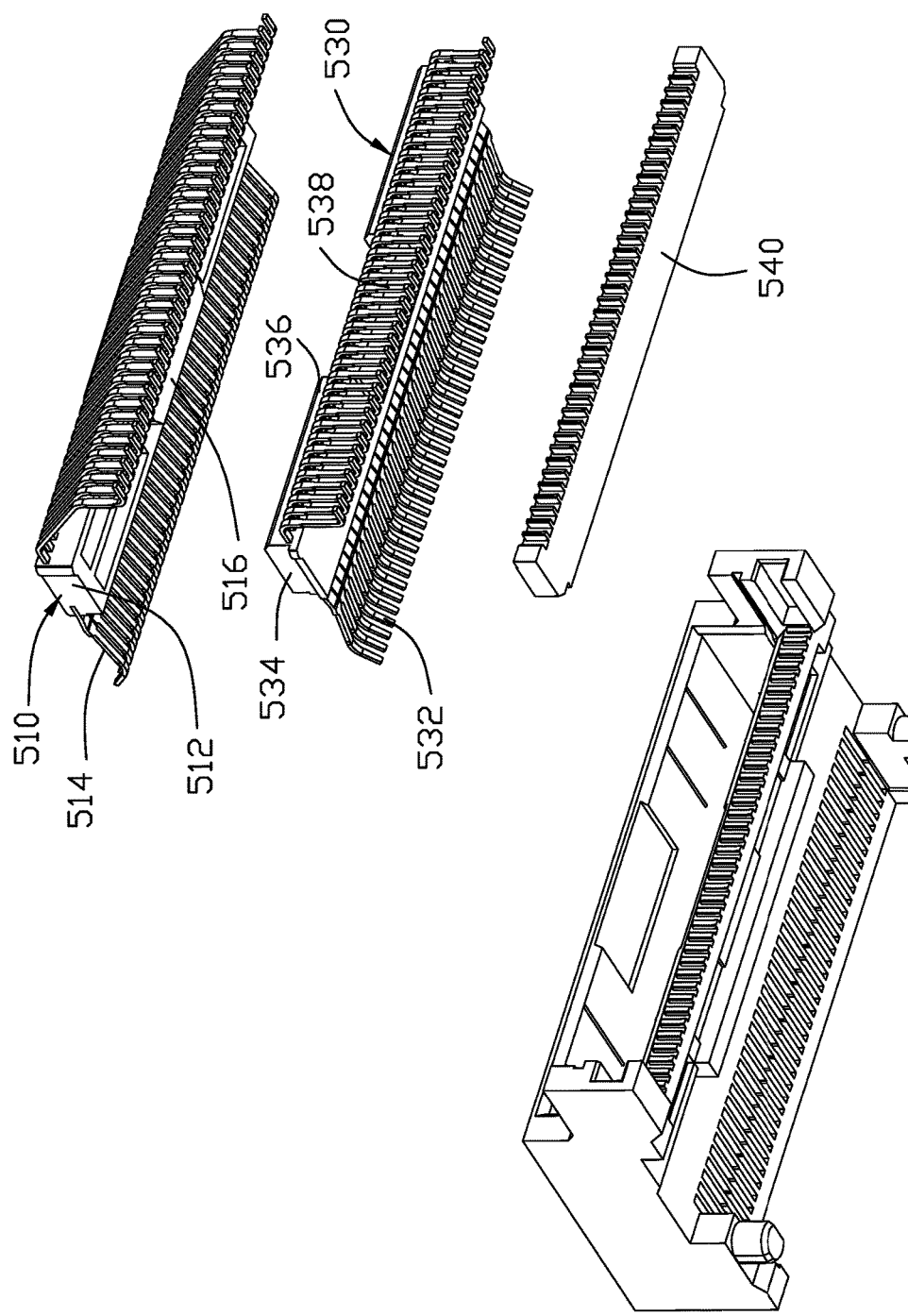
FIG. 10(B) is a further rear exploded perspective view of the receptacle connector of FIG. 9(A)
Figure 11:
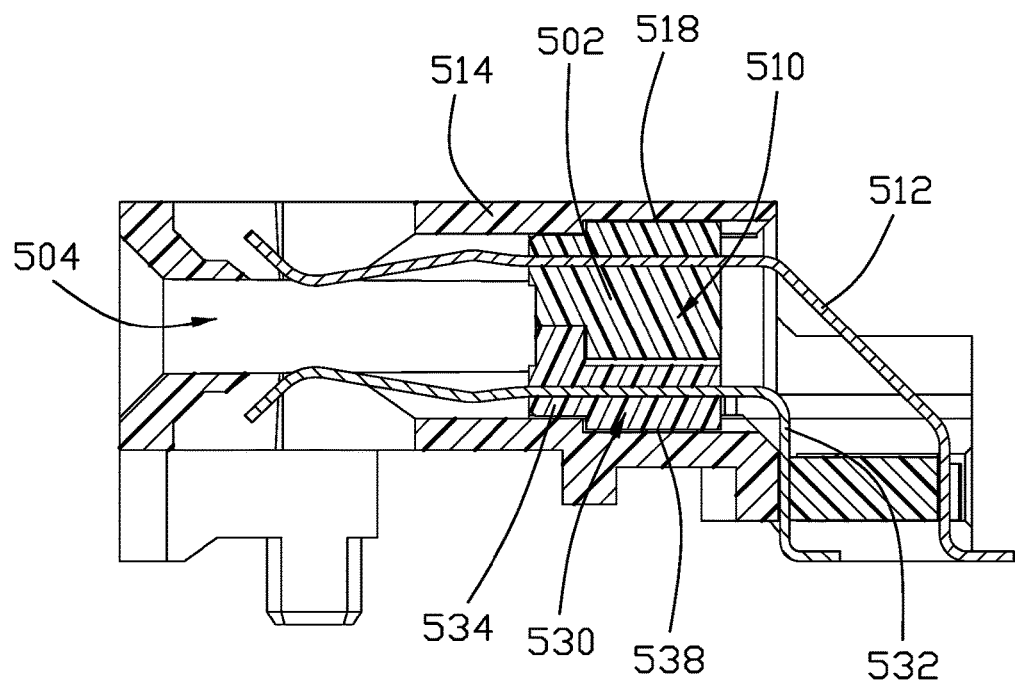
FIG. 11 is a cross-sectional view of the receptacle connector of FIG. 1.
Figure 13:
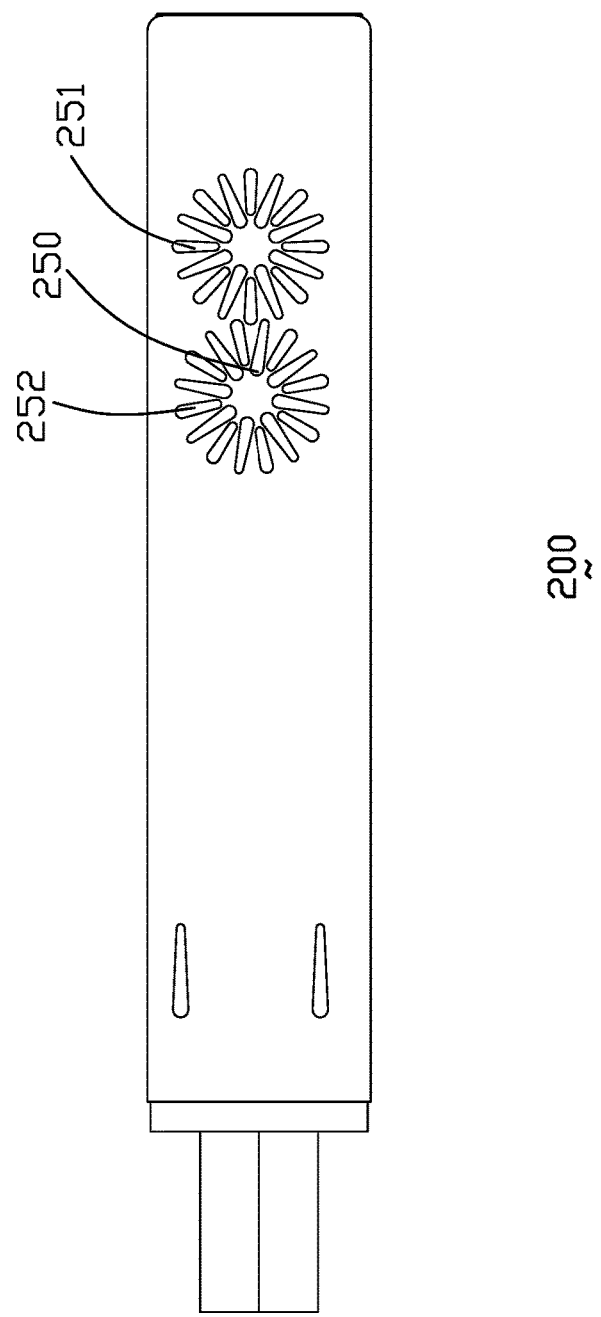
FIG. 13 is a top view of the plug connector of FIG. 1.
Figure 14:
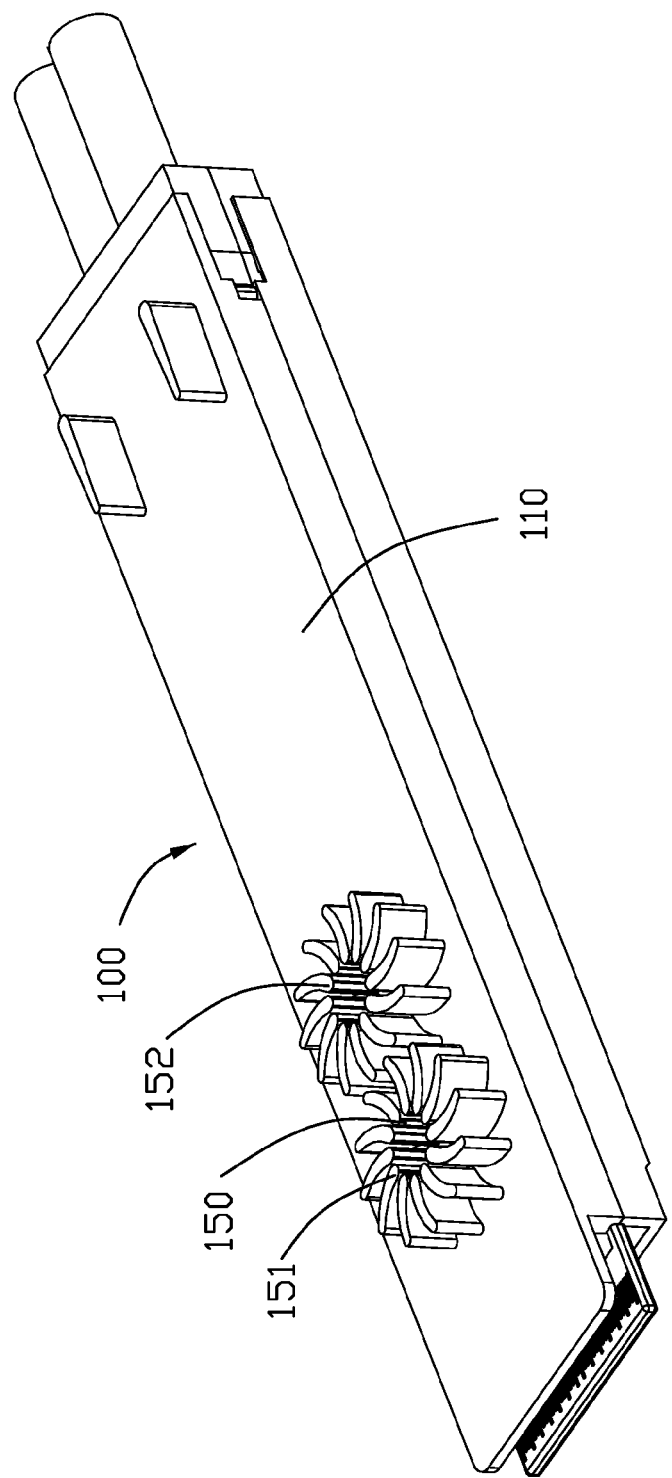
FIG. 14 is a perspective view of a second embodiment of the plug connector for use with the receptacle connector mounted upon the printed circuit board of FIG. 1.
Figure 15:
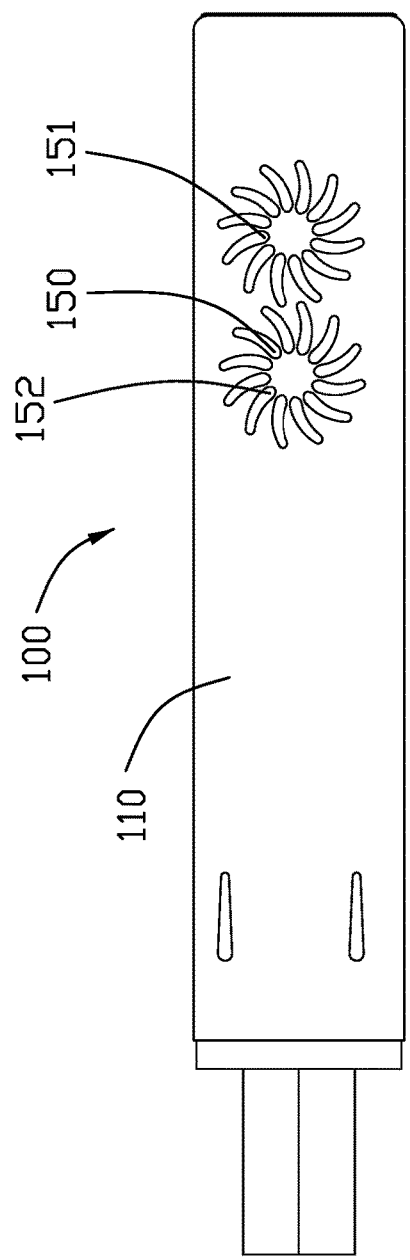
FIG. 15 is a top view of the plug connector of FIG. 14.
Figure 16B:
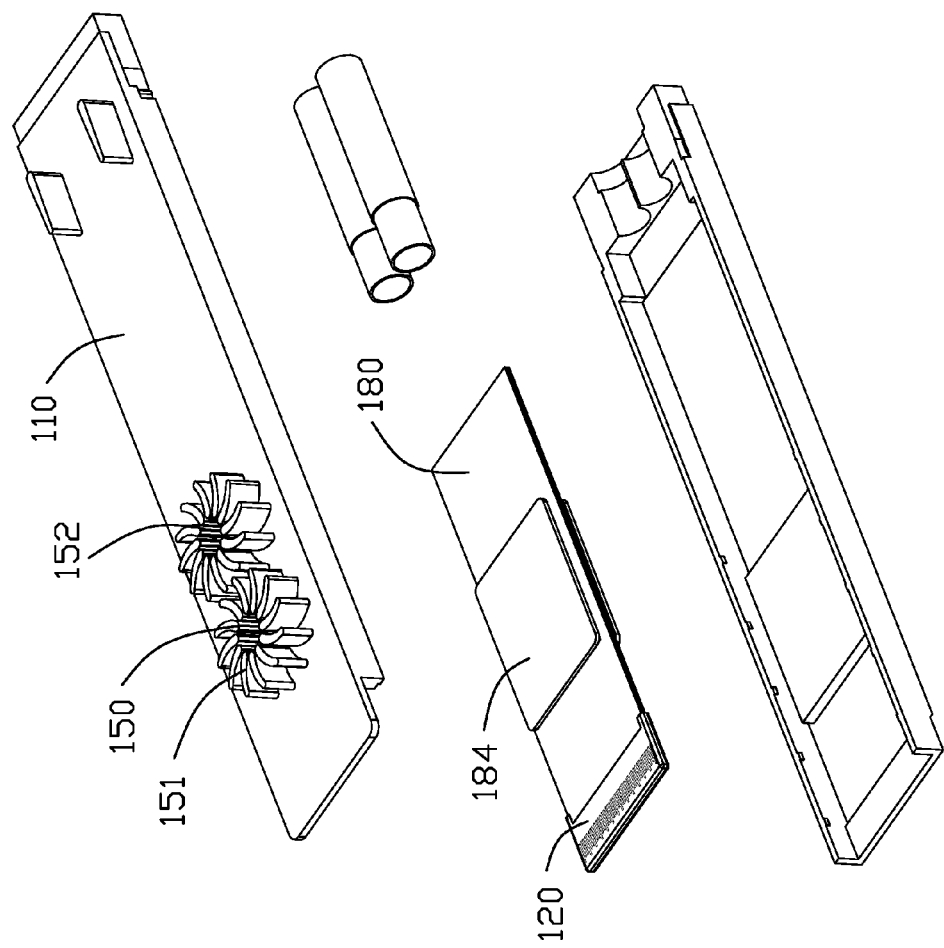
FIG. 16(B) is a front downward exploded view of the plug connector of FIG. 14.
Figure 17:
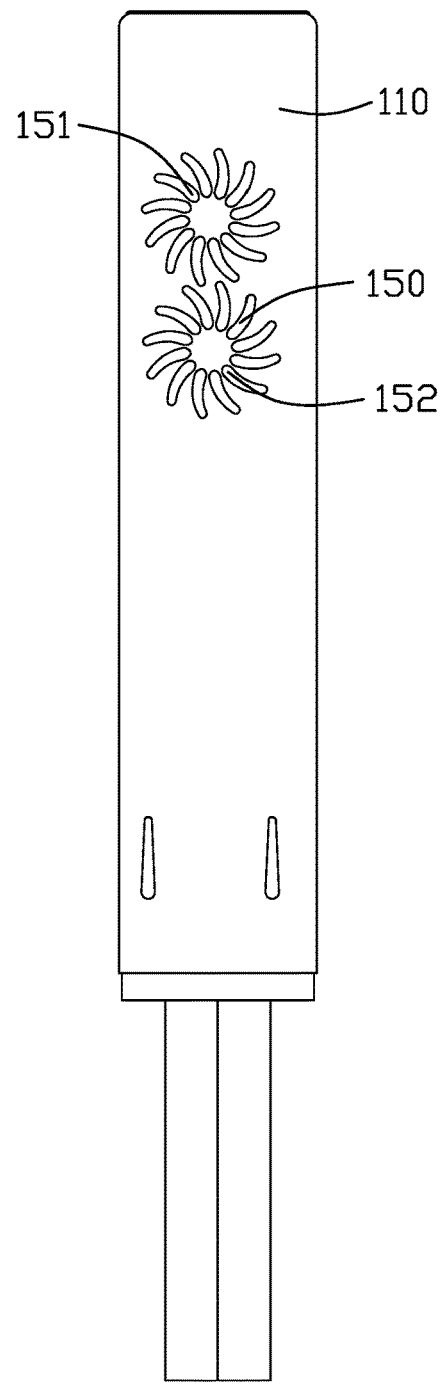
FIG. 17 shows the location relationship among the heat sink member, the electronic components and the thermal pad of FIG. 14.

Referring to FIGS. 1 to 8, 12 and 13, a first embodiment of this invention includes a cable connector or a plug connector 200 mated with a receptacle connector 500 mounted upon a printed circuit board 600. The cable connector 200 includes a metallic enclosure 210 with a heat sink member 250 exposed on an exterior surface to enclose a printed circuit board 280 with electronic components 282 thereon. A thermal pad 284 is sandwiched between the electronic component 282 and the metallic enclosure 210 to dissipate heat from the electronic component 282 to the metallic enclosure 210 and eventually to the air via the heat sink member 250. A plurality of pads 286, which are shown in FIG. 8 rather than in other figures, are formed on a front region of the printed circuit board 280.

An attachment connection unit 220 includes a plurality of contacts 222 respectively soldered upon the corresponding pads 286 and an insulative housing 224 enclosing the contacts 222 and the front region of the printed circuit board 280 via an insert-molding process. The attachment connection unit 220 is located at a front opening 211 of the enclosure 210 to be exposed toward an exterior.

Referring to FIGS. 9 to 12, the receptacle connector 500 includes an insulative housing 502 forming a mating cavity 504 to receive the attachment connection unit 220 therein. An upper terminal module 510 and a lower terminal module 530 are stacked with each other in a vertical direction and commonly received within the housing 502. The upper terminal module 510 includes a plurality of upper terminals 512 retained in an upper insulator 514; the lower terminal module 530 includes a plurality of lower terminals 532 retained in a lower insulator 534.

Notably, the upper insulator 514 includes a downward protrusion 516 to be received within a downward recess 536 in the lower insulator 534 for engagement therebetween. In addition, the upper insulator 514 forms an upward protrusion 518 and the lower insulator 534 forms a downward protrusion 538 to abut against the housing 502. An insulative spacer 540 separates tails of the upper terminals 512 and those of the lower terminals 532 in a front-to-back direction. The upper terminal module 510, the lower terminal module 530 and the spacer 540 are configured to have the lower terminal module 530, the spacer 540 and the upper terminal module 510 forwardly assembled to the housing 502 from a rear side of the housing 502 in sequence.

In this embodiment, a cable set 290 is linked to a rear end of the printed circuit board 280. Also, in this embodiment, the heat sink member 250 comprises a first heat sink 251 and a second heat sink 252 commonly located above the thermal pad 284. Both of the first heat sink 251 and a second heat sink 252 have a radial shaped and are unitarily formed on the metallic enclosure 210. The metallic enclosure 210 is formed by die-casting processing or other suitable processing.

Figure 18:
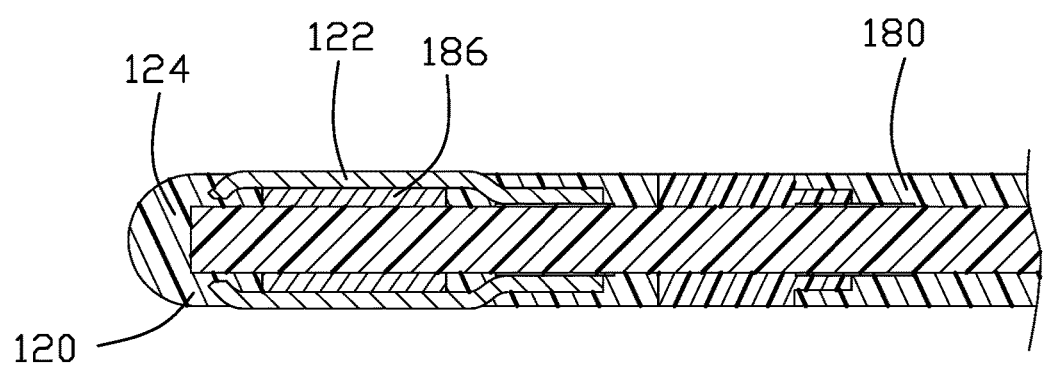
FIG. 18 shows the relation between the printed circuit board and the attachment connection unit.
Figure 19:
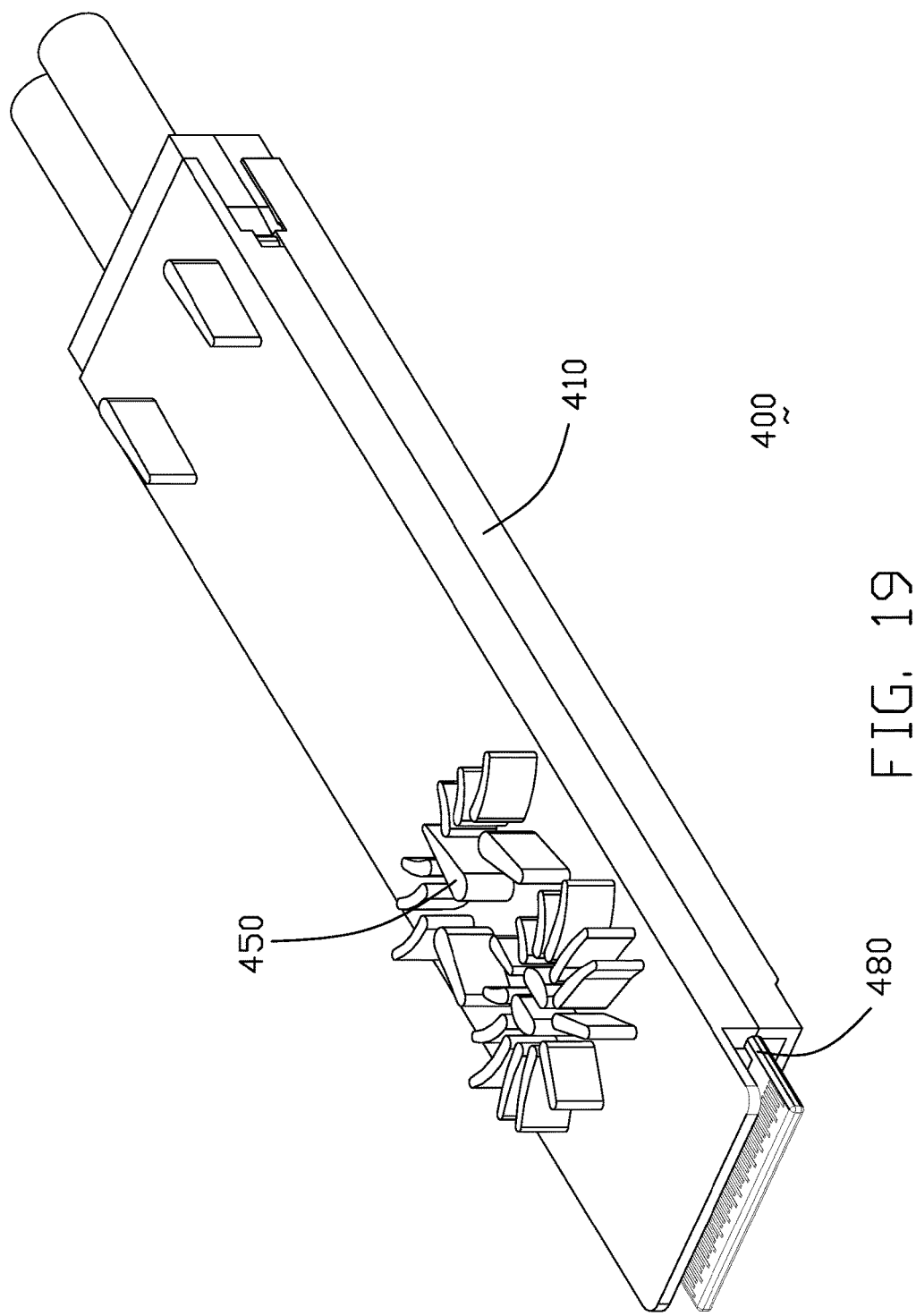
FIG. 19 is a perspective view of a third embodiment of the plug connector in accordance with present invention.
Figure 20:
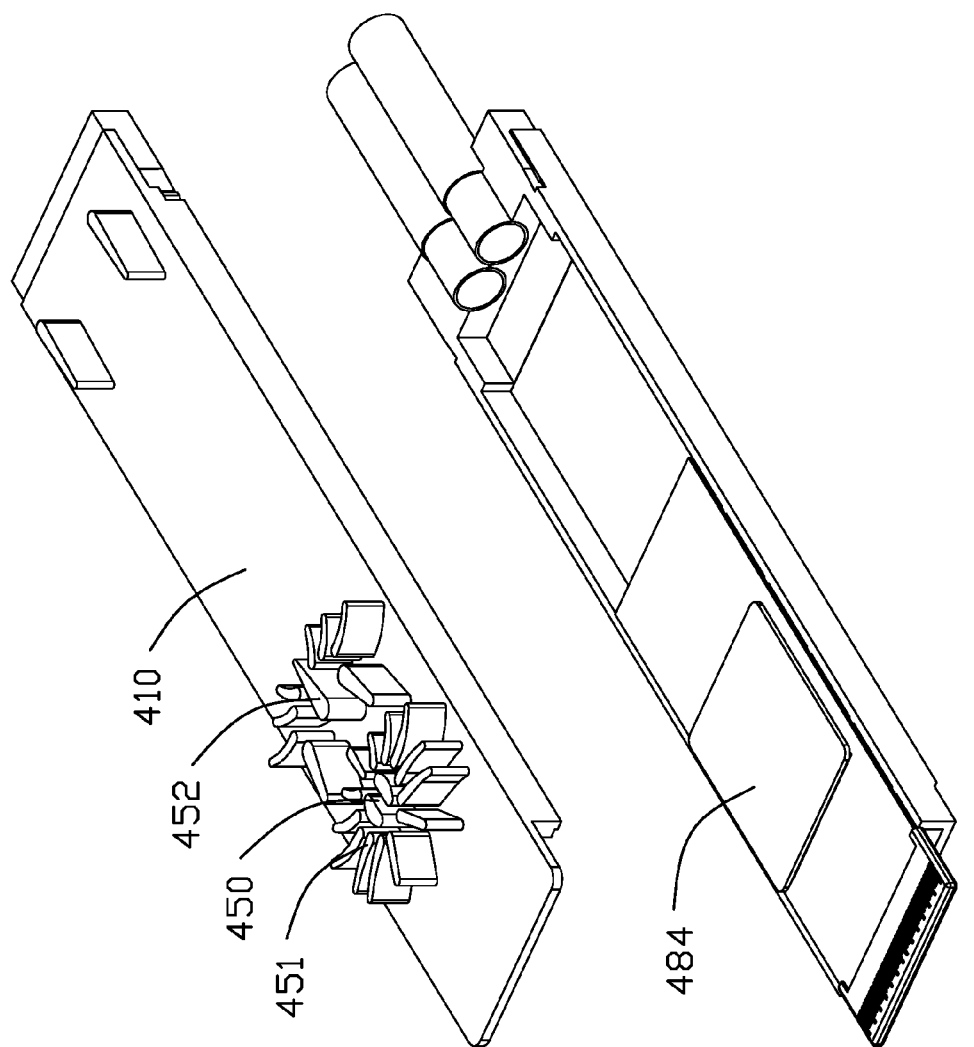
FIG. 20 is an exploded perspective view of the plug connector of FIG. 19.
Figure 21:
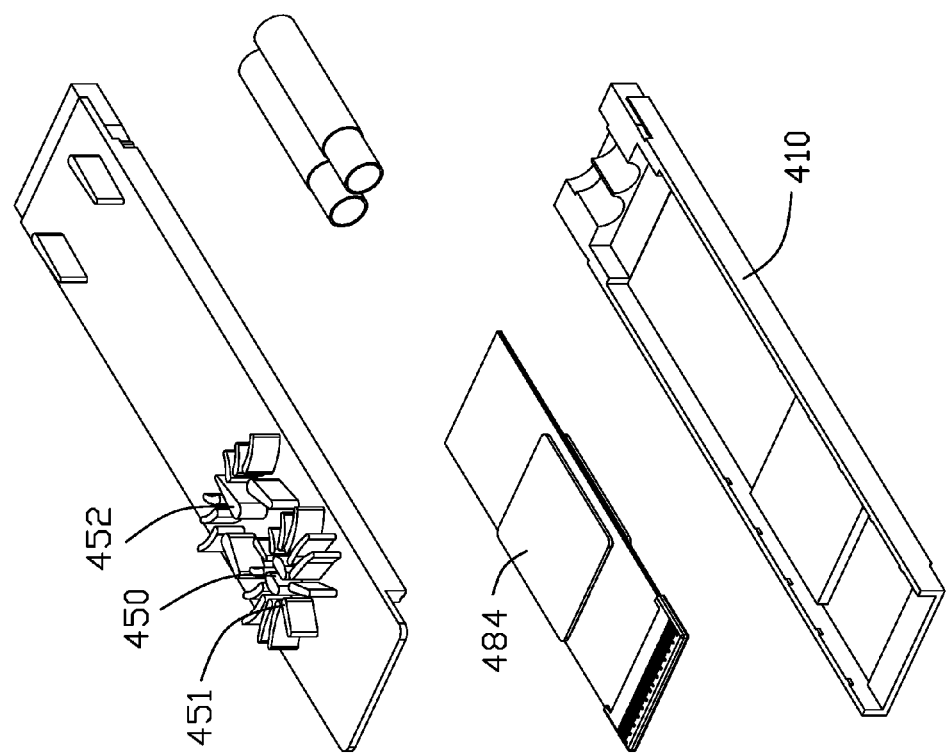
FIG. 21 is a further exploded perspective view of the plug connector of FIG. 20.
Figure 22:
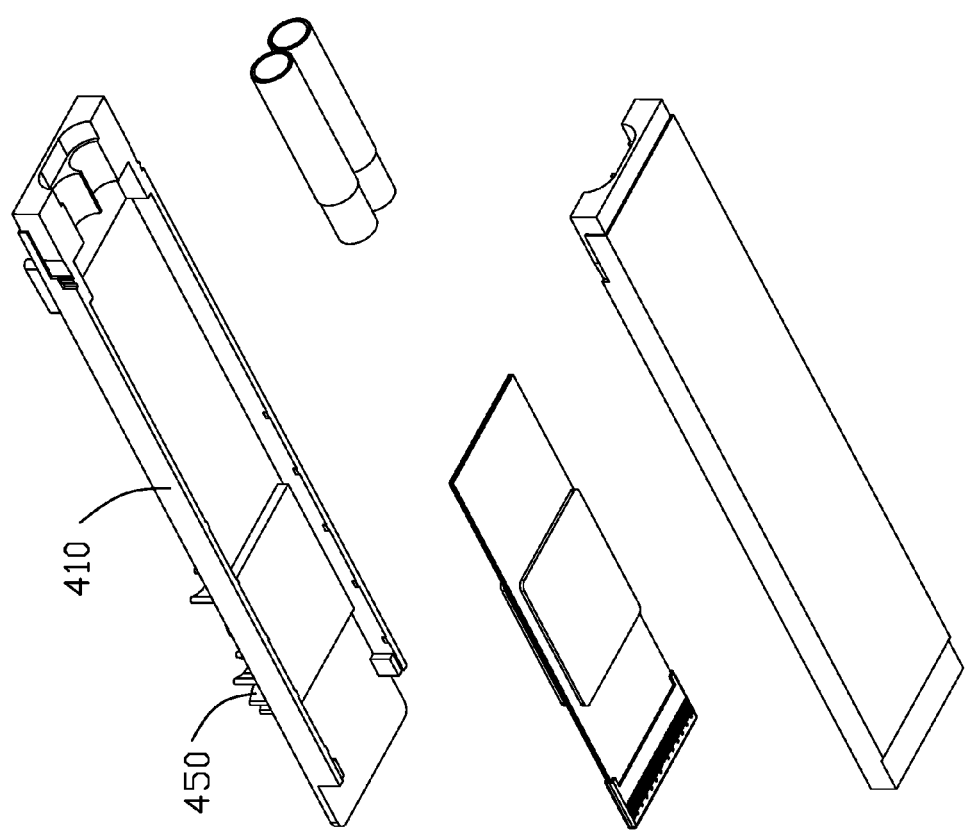
FIG. 22 is another exploded perspective view of the plug connector of FIG. 21.
Figure 23:
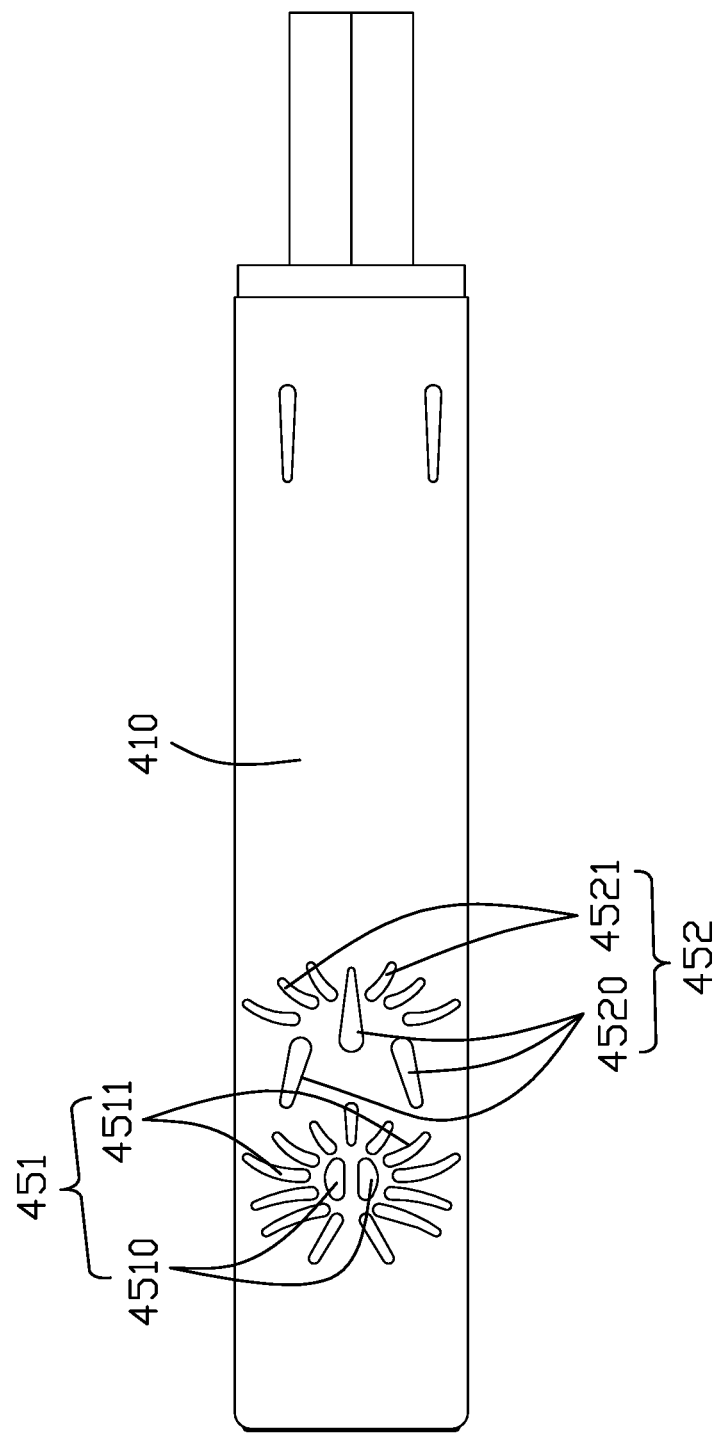
FIG. 23 is a top view of the plug connector of FIG. 19.
Figure 24A:
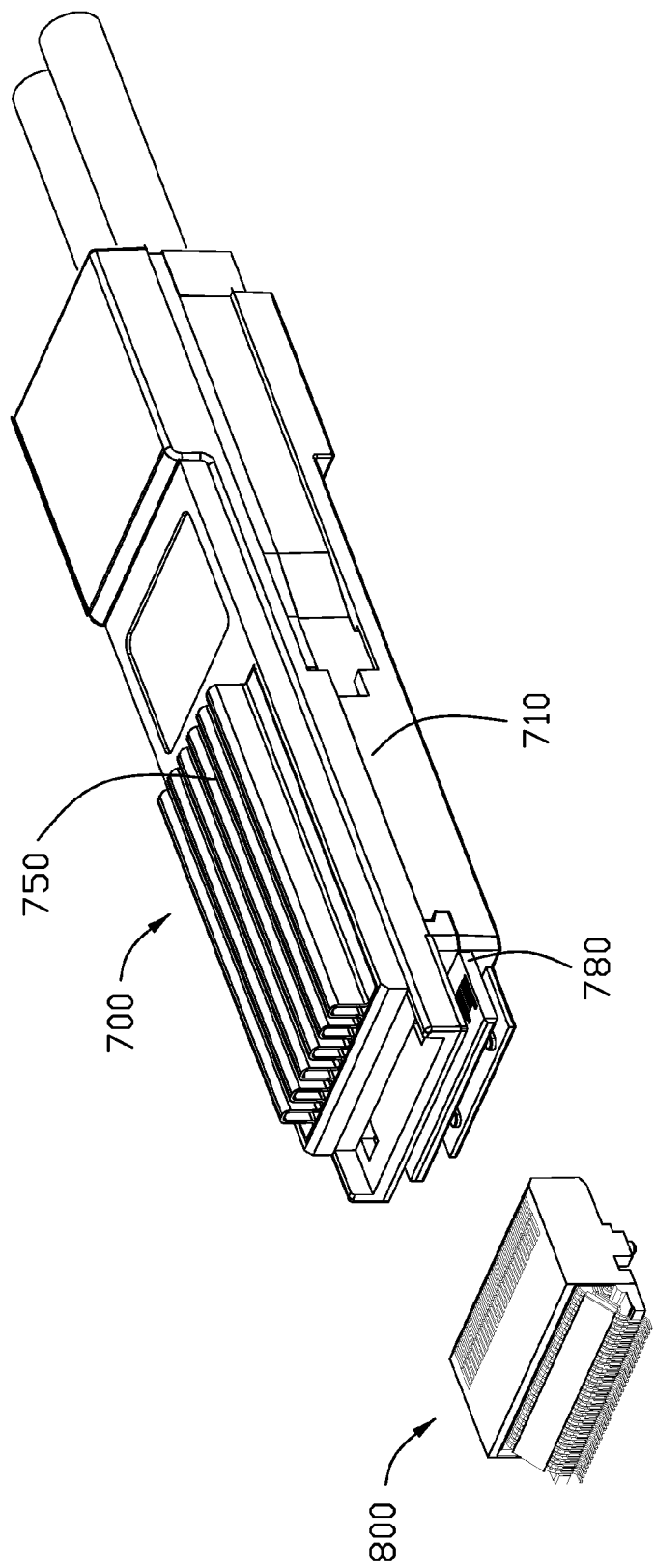
FIG. 24(A) is a front perspective view of a fourth embodiment of an electrical connector assembly including a plug connector adapted to be mated with a receptacle connector in according with present invention.
Figure 24B:
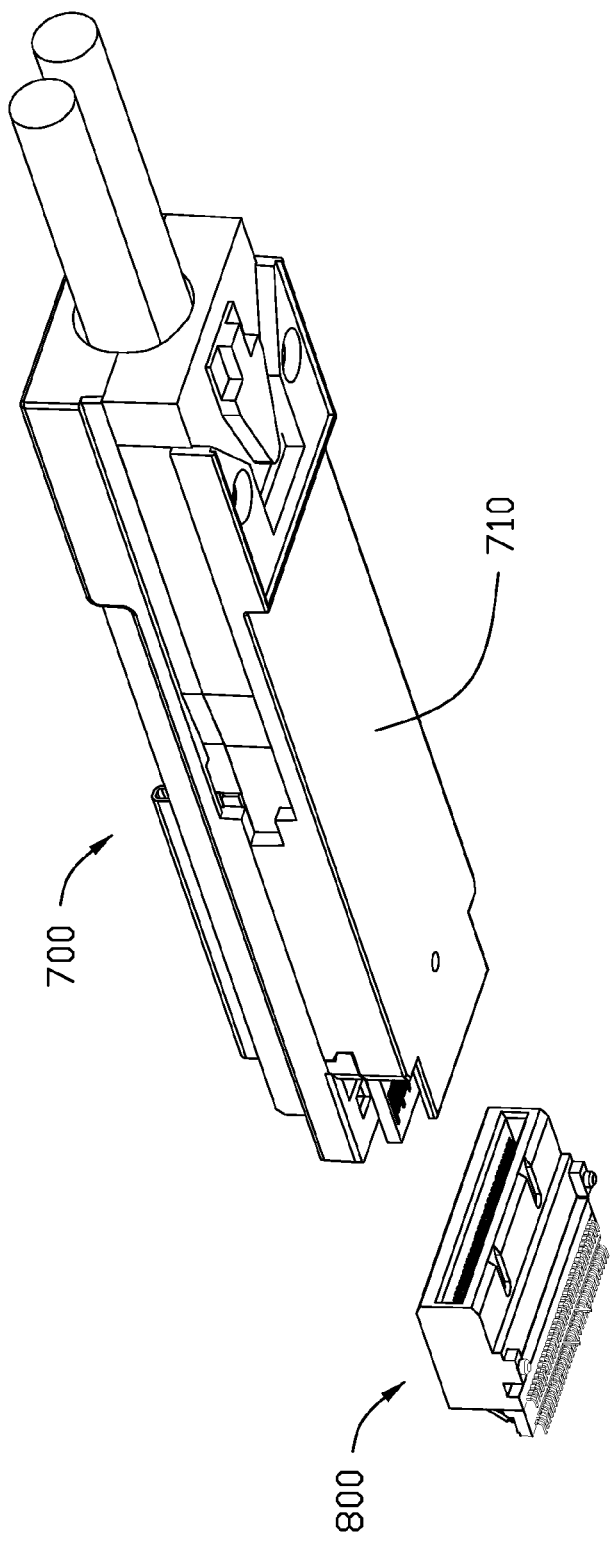
FIG. 24(B) is a rear perspective view of the electrical connector assembly of FIG. 24(A)
Figure 24C:
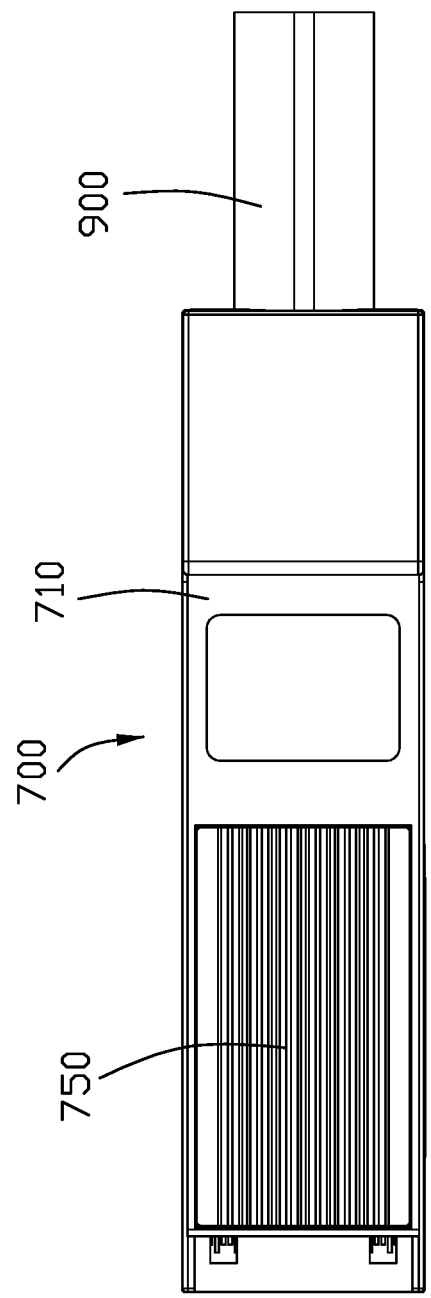
FIG. 24(C) is an elevational view of the plug connector of FIG. 24(A)
Figure 25:
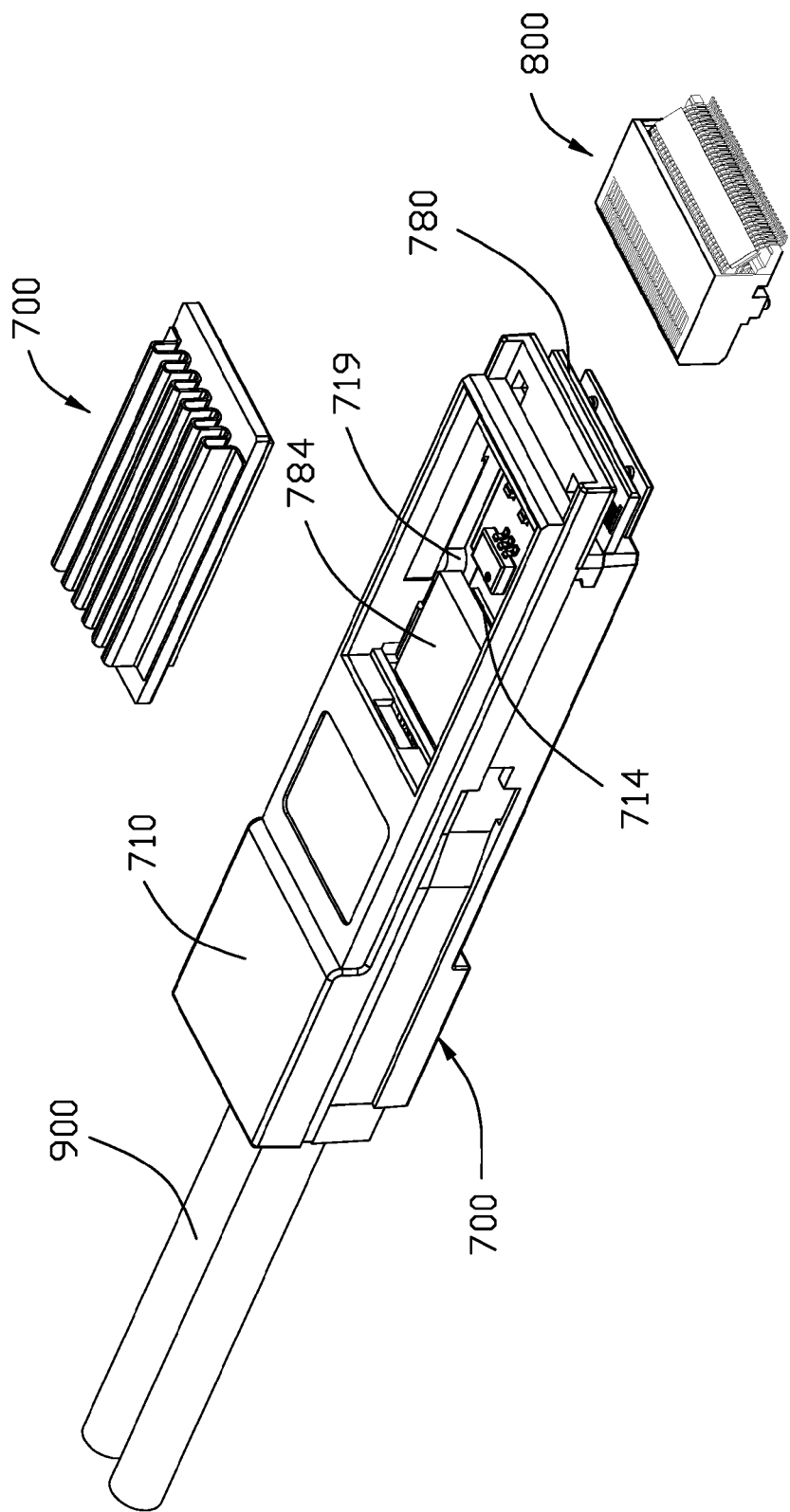
FIG. 25 is an exploded perspective view of the electrical connector assembly of FIG. 24(A) wherein the heat sink member of the plug connector is disassembled.
Figure 26:
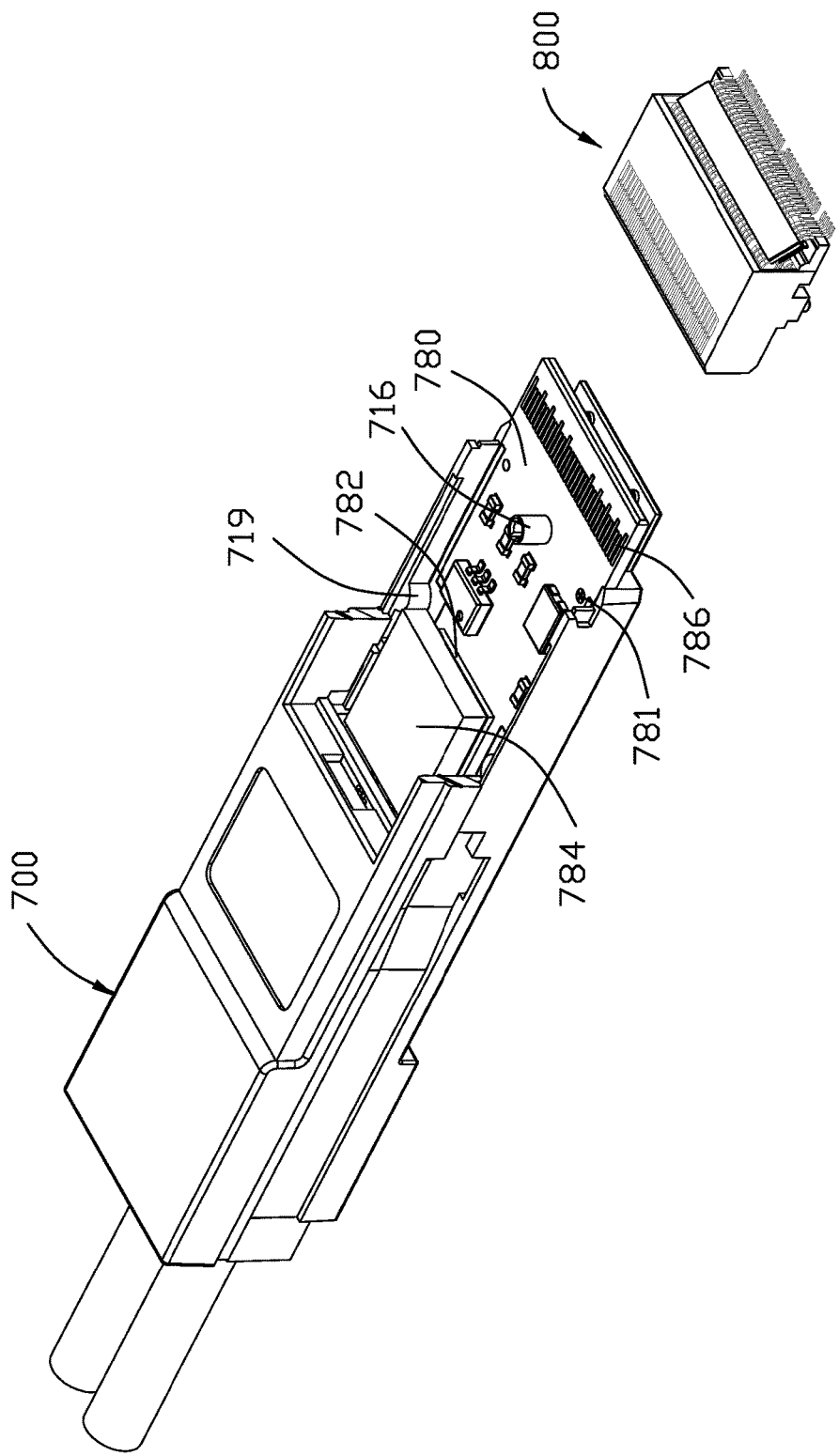
FIG. 26 is a further exploded perspective view of the electrical connector assembly of FIG. 25 wherein a part of the shell of the plug connector is removed.
Figure 27:
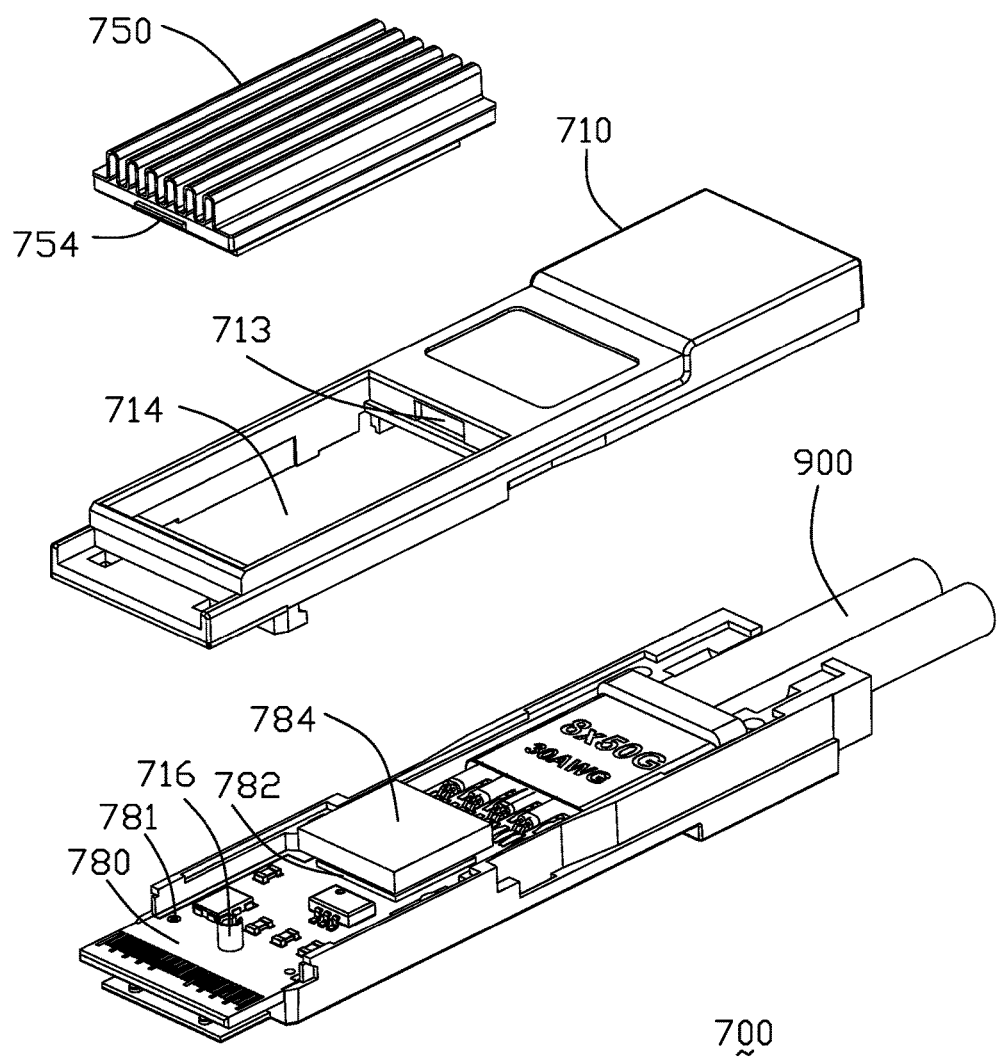
FIG. 27 is a further exploded perspective view of the plug connector of FIG. 26.
Figure 28A:
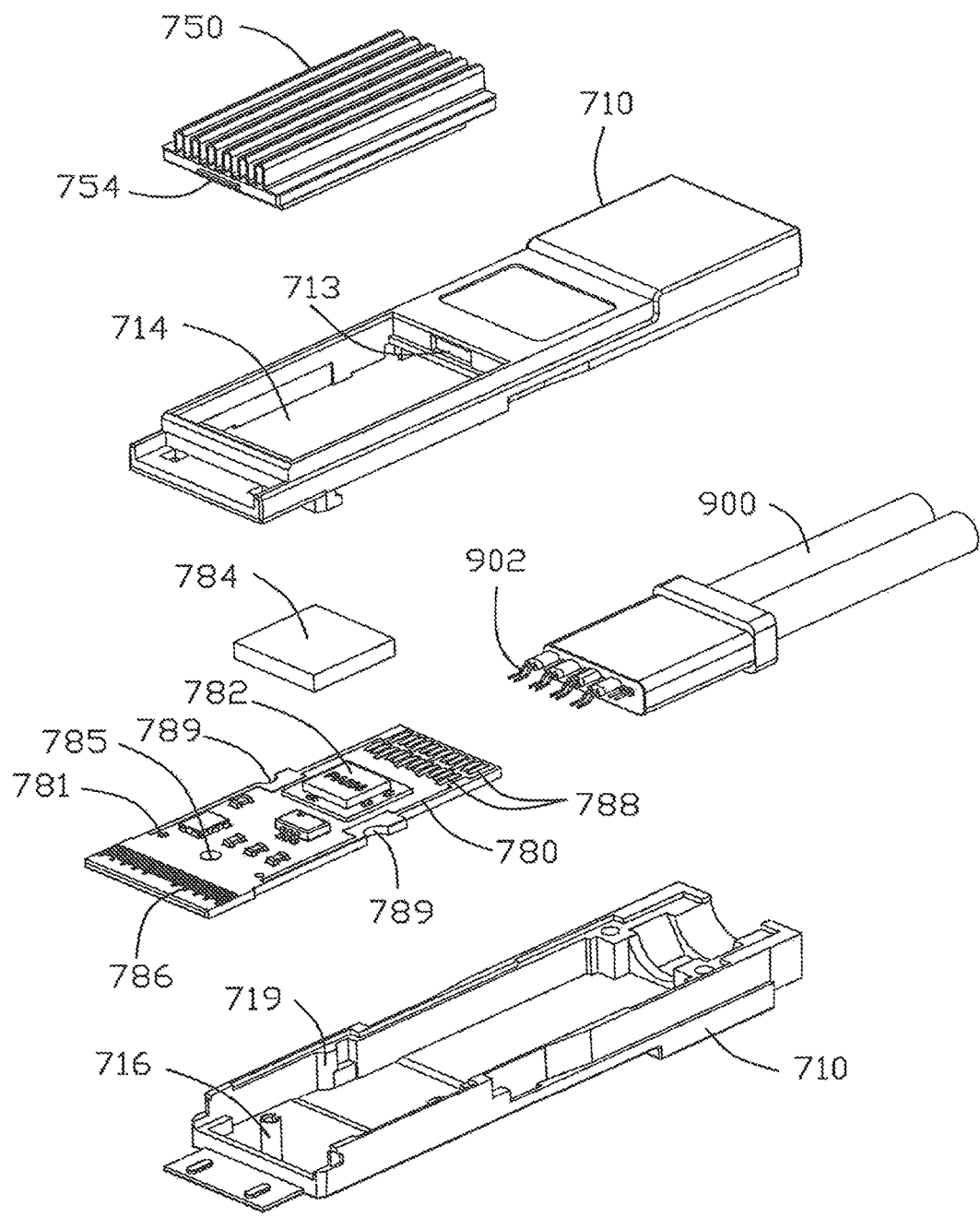
FIG. 28(A) is a further front exploded perspective view of the plug connector of FIG. 27.
Figure 28B:
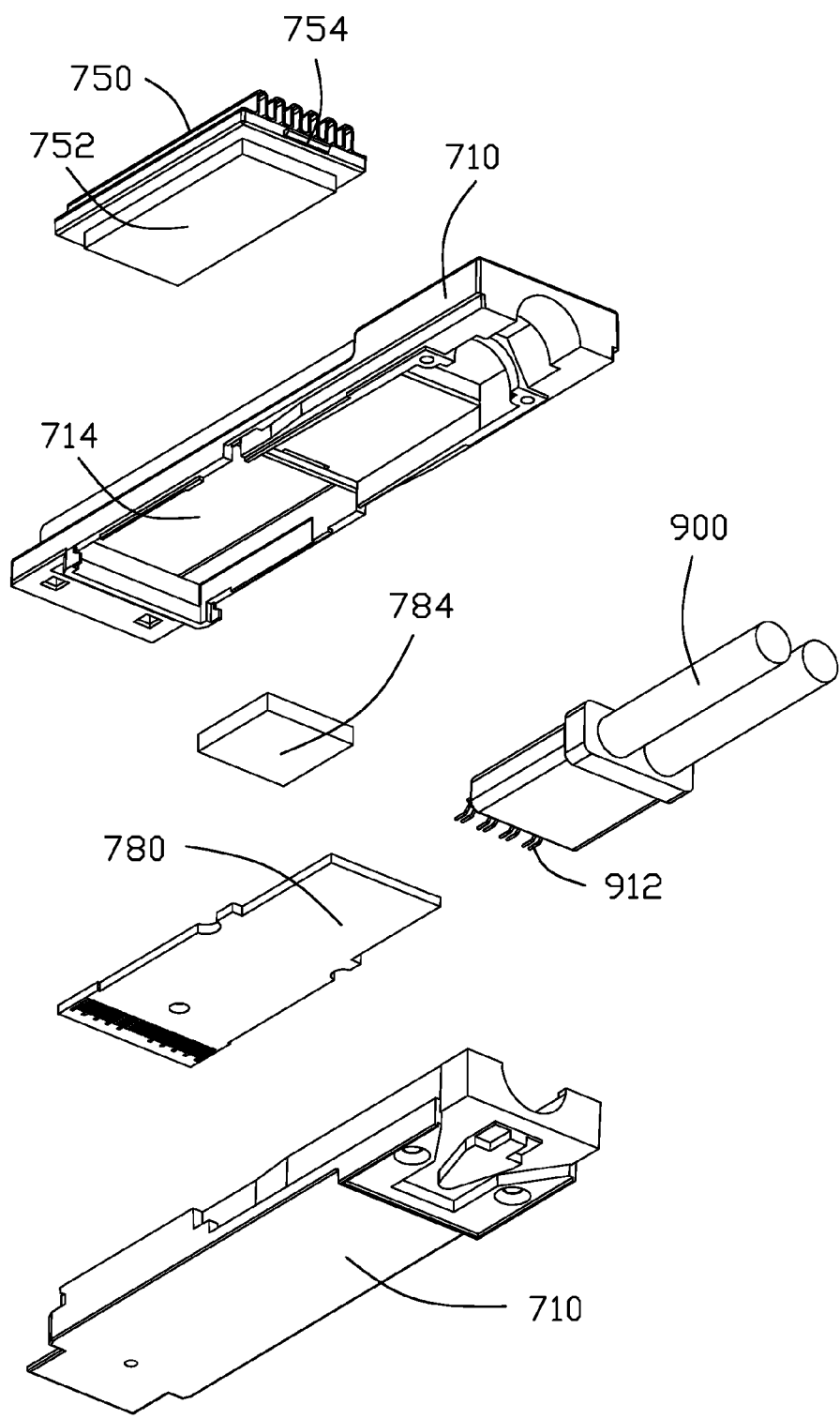
FIG. 28(B) is a further rear exploded perspective view of the plug connecter of FIG. 27.
Figure 29A:
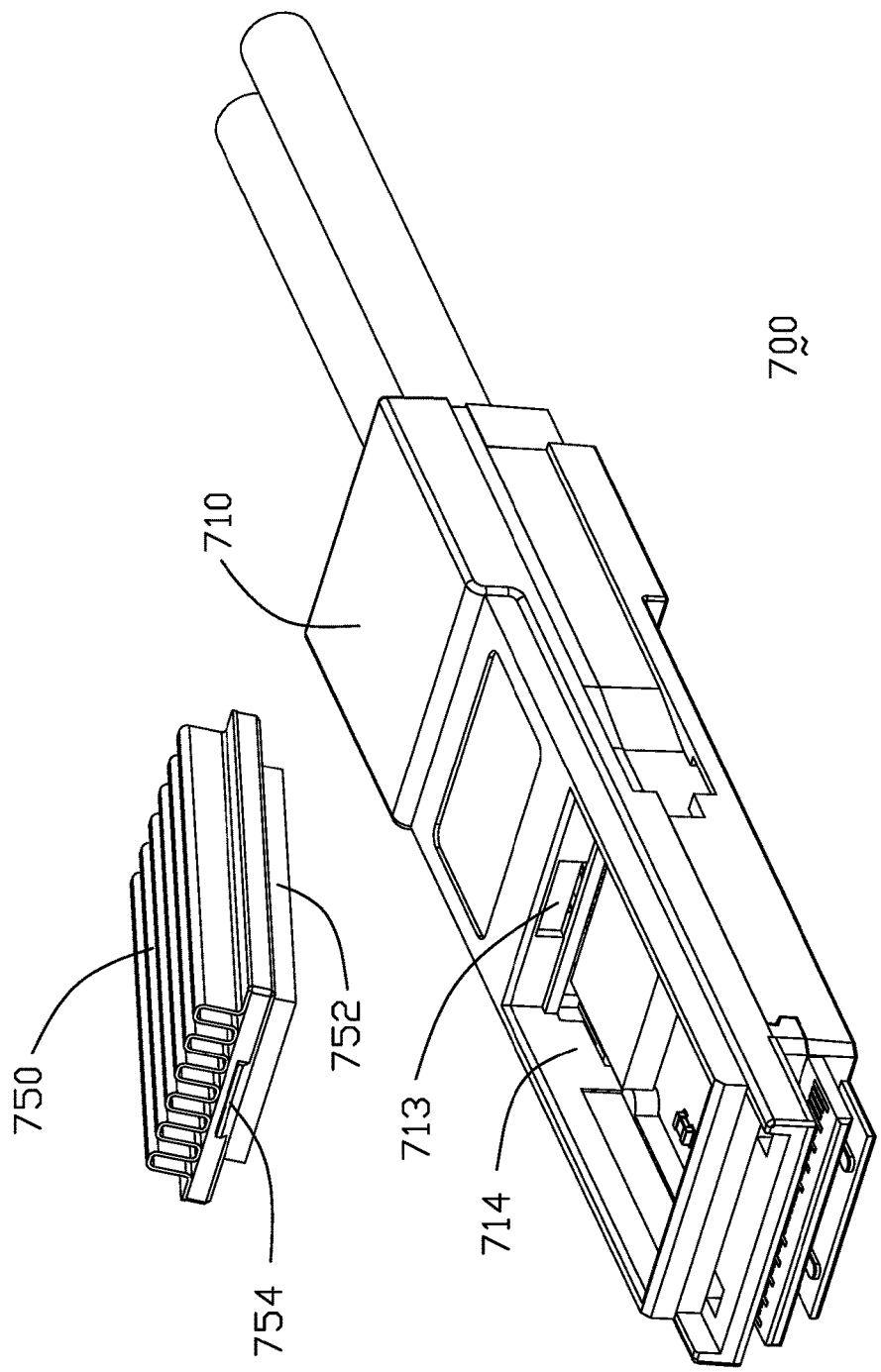
FIG. 29(A) is a front exploded perspective view of the plug connector of FIG. 25 to show the heat sink member is detached from the shell.
Figure 29B:
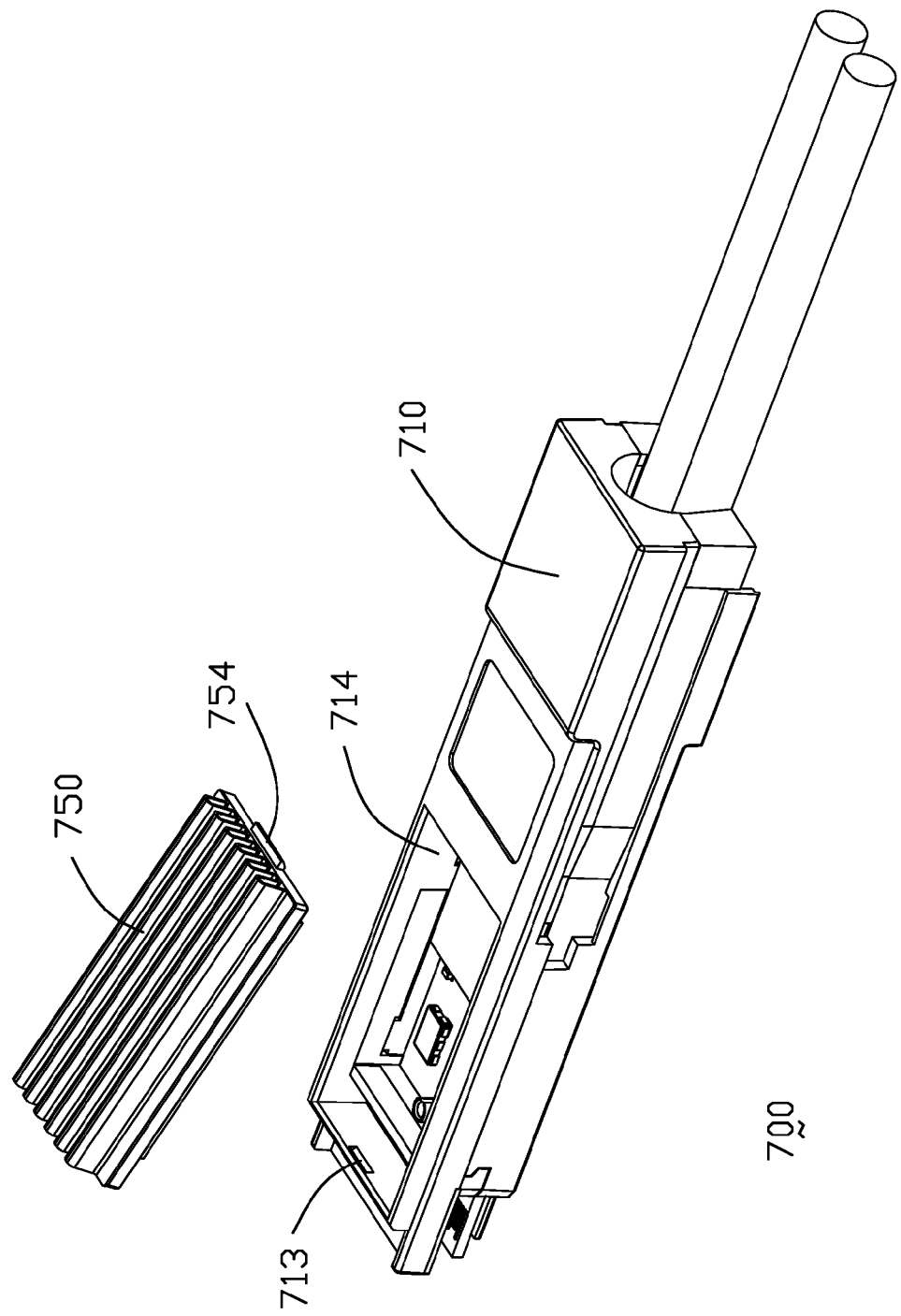
FIG. 29(B) is a rear exploded perspective view of the plug connecter of FIG. 25 to show the heat sink member is detached from the shell.
Figure 30A:
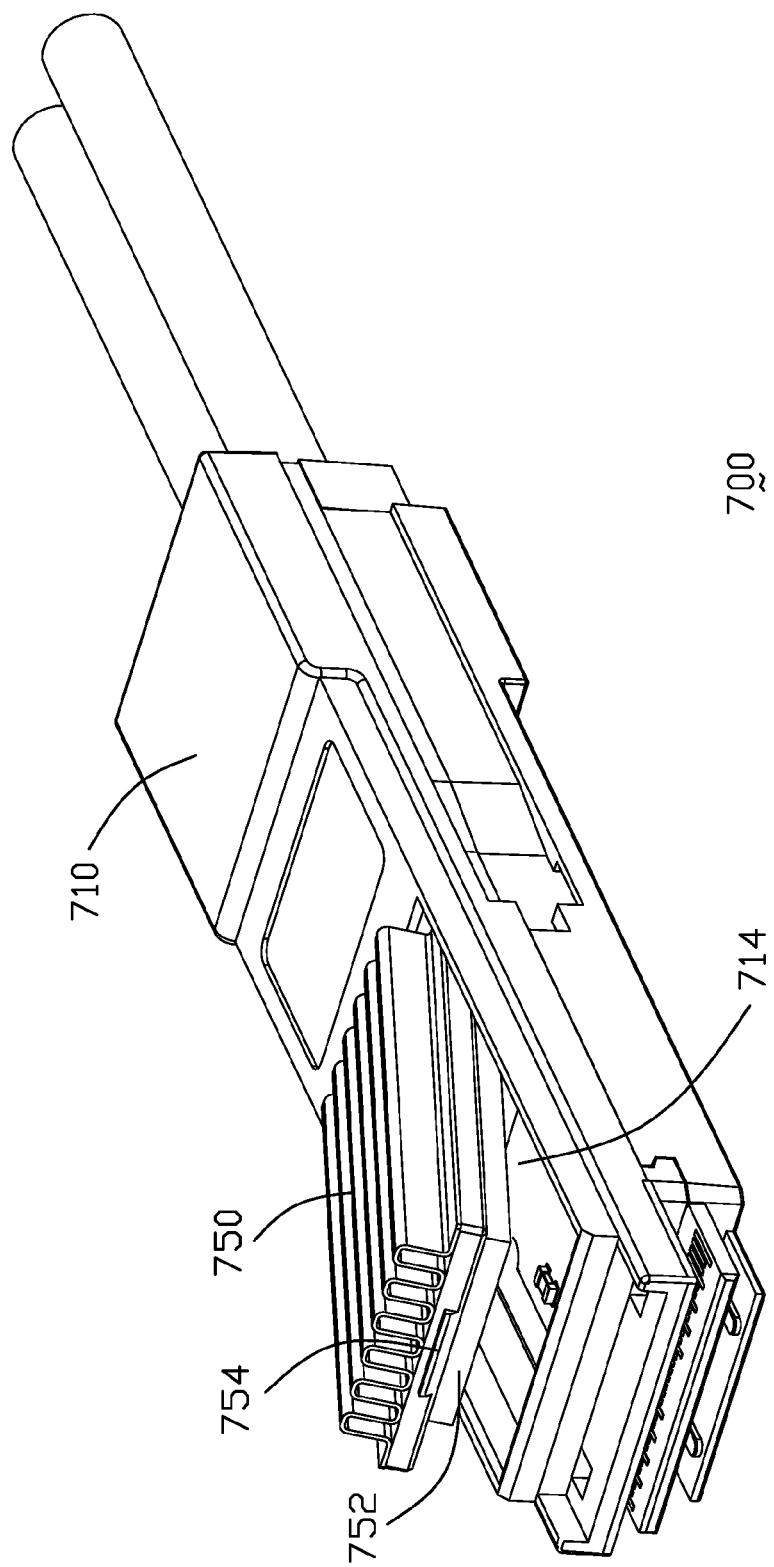
FIG. 30(A) is a front exploded perspective view of the plug connector of FIG. 25 to show the heat sink member is partially attached to the shell.
Figure 30B:
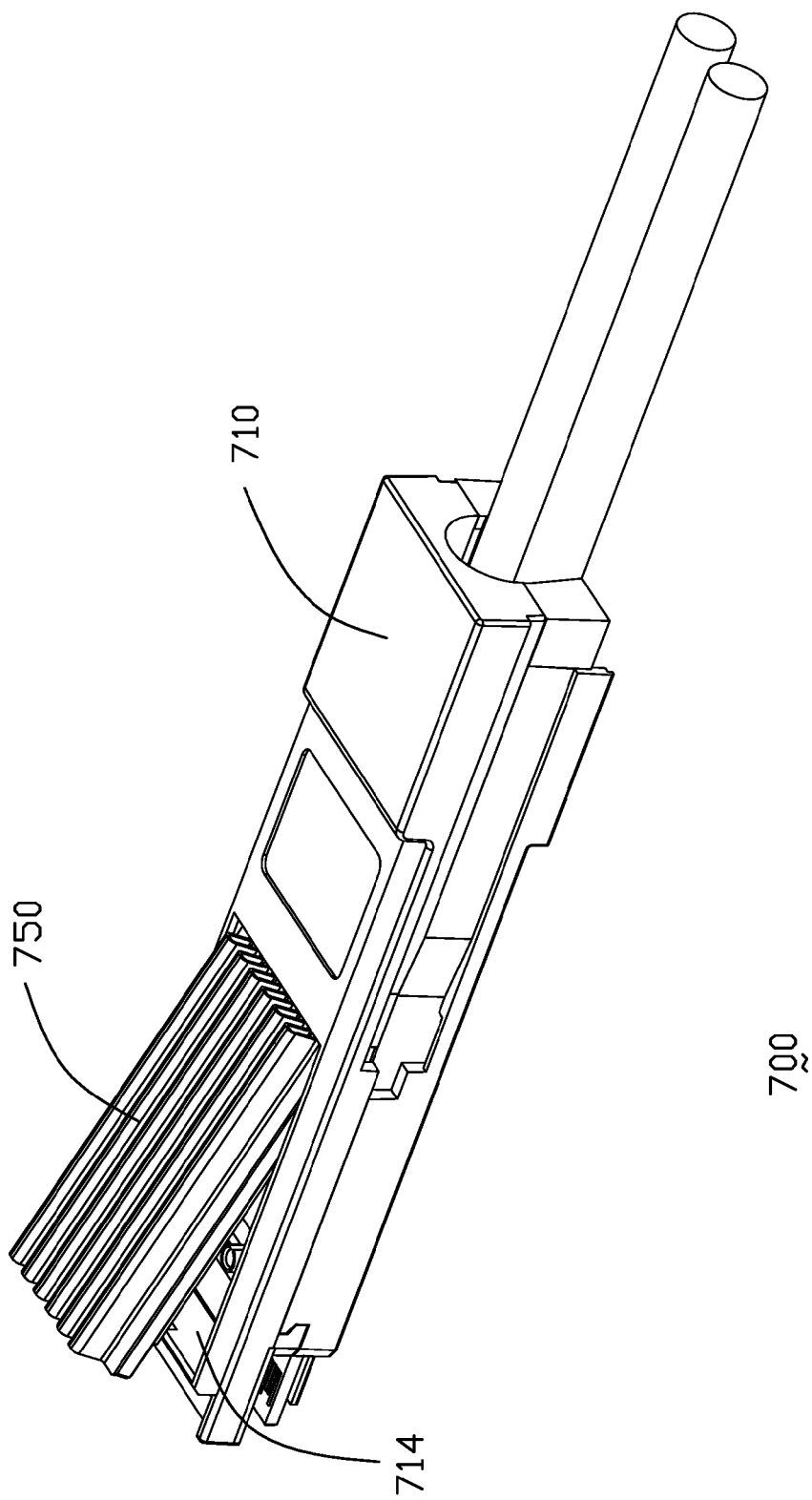
FIG. 30(B) is a rear exploded perspective view of the plug connector of FIG. 25 to show the heat sink member is partially attached to the shell.

Referring to FIGS. 14 to 18, a second embodiment of the plug connector 100 in accordance with present invention, the plug connector 100 comprises a metallic enclosure 110 with a heat sink member 150 exposed on an exterior surface to enclose a printed circuit board 180. A thermal pad 184 is sandwiched between the electronic component and the metallic enclosure 110 to dissipate heat from the electronic component to the metallic enclosure 110 and eventually to the air via the heat sink member 150. A plurality of pads 186, which are shown in FIG. 18 are formed on a front region of the printed circuit board 180. An attachment connection unit 120 includes a plurality of contacts 122 respectively soldered upon the corresponding pads 186 and an insulative housing 124 enclosing the contacts 122 and the front region of the printed circuit board 180 via an insert-molding process. The main difference between the first and the second embodiments of the plug connector 200, 100 is the heat sink member 150 of the second embodiment of the plug connector 100 is essentially of a rotary/turbinate shaped. The heat sink member 150 also comprising a first heat sink 151 and a second heat sink 152 commonly located above the thermal pad 184.

Notably, either the radial shaped or the rotary shaped of the heat sink member 250, 150 may efficiently transfer the heat from the center where the heat source is located, compared with the traditional heat sink member having the parallel fins therewith. In those embodiments, a center of the heat sink structure may be vertical aligned with the corresponding electronic components 282 or the center of the terminal pad 284, 184.

Referring to FIGS. 19-23, a third embodiment of the plug connector 100 in accordance with present invention, the plug connector 400 comprises a metallic enclosure 410 with a heat sink member 450 exposed on an exterior surface to enclose a printed circuit board 480. A thermal pad 484 is sandwiched between the electronic component and the metallic enclosure 410 to dissipate heat from the electronic component to the metallic enclosure 410 and eventually to the air via the heat sink member 450. The heat sink member 450 includes a first heat sink 451 and a second heat sink 452 commonly located above the thermal pad 484. The main difference between the first and the third embodiments of the plug connector 200, 400 is the heat sink member 450. The first heat sink 451 includes a pair of center fins 4510 surrounded by a plurality of peripheral fins 4511 each being curved in a radial direction. Notably, the peripheral fins 4511 are essentially divided into two groups in a lengthwise direction of said plug connector 400 wherein the group closer to the second heat sink 452 includes one additional fin along the centerline compared with the other group farther from the second heat sink 452. The second heat sink 452 includes a three primary fins 4520 arranged in a triangular manner, and two groups of secondary fins 4521 located by two sides of the primary fin 4520 located in the centerline of the plug connector 400 extending along the lengthwise direction. Understandably, the heat sink member 450 may be efficiently transferred/dissipated when the air flow moves along the lengthwise direction. The feature of this embodiment is to provide the heat sink member 450 with the turbinate/rotary type fins so as to form a turbulent air flow during heat transfer while also leaving a passage around the center line to allow the airflow to pass along the lengthwise direction.

Referring to FIGS. 24(A)-32(B) and 35, a fourth embodiment of this invention includes a cable connector or a plug connector 700 mated with a receptacle connector 800 adapted mounted upon a printed circuit board (not shown). The cable connector 700 includes a metallic enclosure 710 with a detachably attached heat sink member 750 to enclose a printed circuit board 780 with electronic components 782 thereon wherein the enclosure 710 includes upper and lower parts assembled to each other in the vertical direction. In this embodiment, the metallic enclosure 710 forms an opening 714 in a top wall to receive the heat sink member 750 therein. The heat sink member 750 includes associatively a thermal portion 752 thereunder. A thermal pad 784 is sandwiched between the electronic component 782 and the heat sink member 750 to dissipate heat from the electronic component 782 to the heat sink member 750. Notably, the thermal portion 752 and the thermal pad 784 are of the same character so as to be deemed as one piece. A plurality of pads 786 are formed on a front region of the printed circuit board 780 in one row with a 0.5 mm pitch, compared with the pads in two rows with a 0.8 mm pitch used in QSFP-DD version. A plurality of pads 788 formed on a rear region of the printed circuit board 780 in two rows. A cable 900 includes a plurality of differential wires 902 soldered upon the corresponding pads 788. The printed circuit board 780 forms a pair of side notches 789 for engagement with the corresponding side posts 719 on an interior surface of the metallic enclosure 710.

To assure the precise position of those conductive pads 786, a pair of fiducial positions 781 are defined in the printed circuit board 780 for easy reference. It is noted that the width dimension of the instant invention is same with the traditional QSFP and QSFP-DD. To facilitate heat dissipation, an empty column 716 is unitarily extends inwardly/vertically in the metallic enclosure 710 extending through the printed circuit board 780 for providing an air intake hole therein and through a through hole 785 in the printed circuit board 780 so guide external air into an interior of the metallic enclosure 710 where the heat sink member 750 downwardly faces.

Figure 31A:
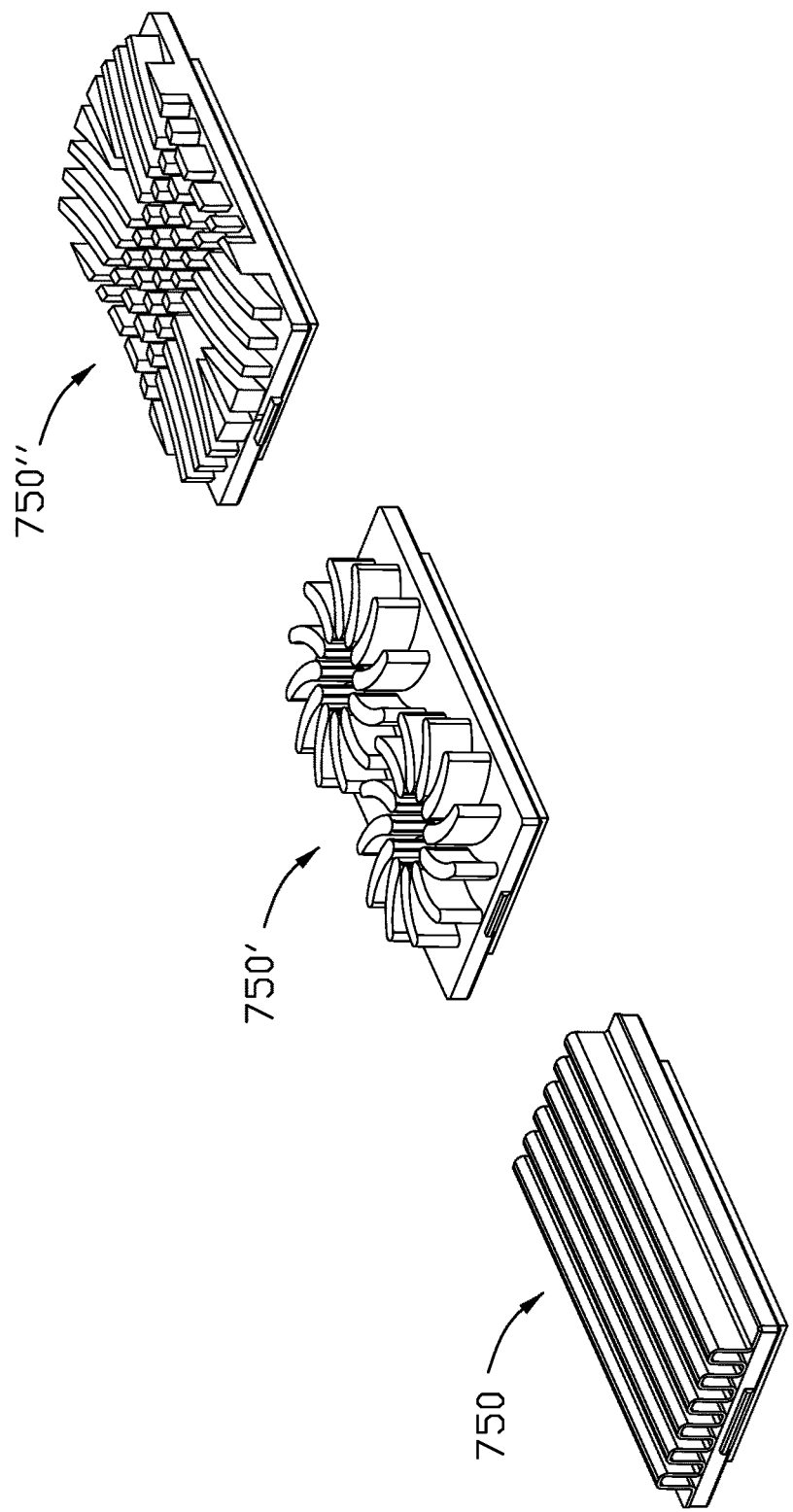
FIG. 31(A) is a downward perspective view of three different type heat sink members adapted to be used with the plug connector of FIG. 25.
Figure 31B:
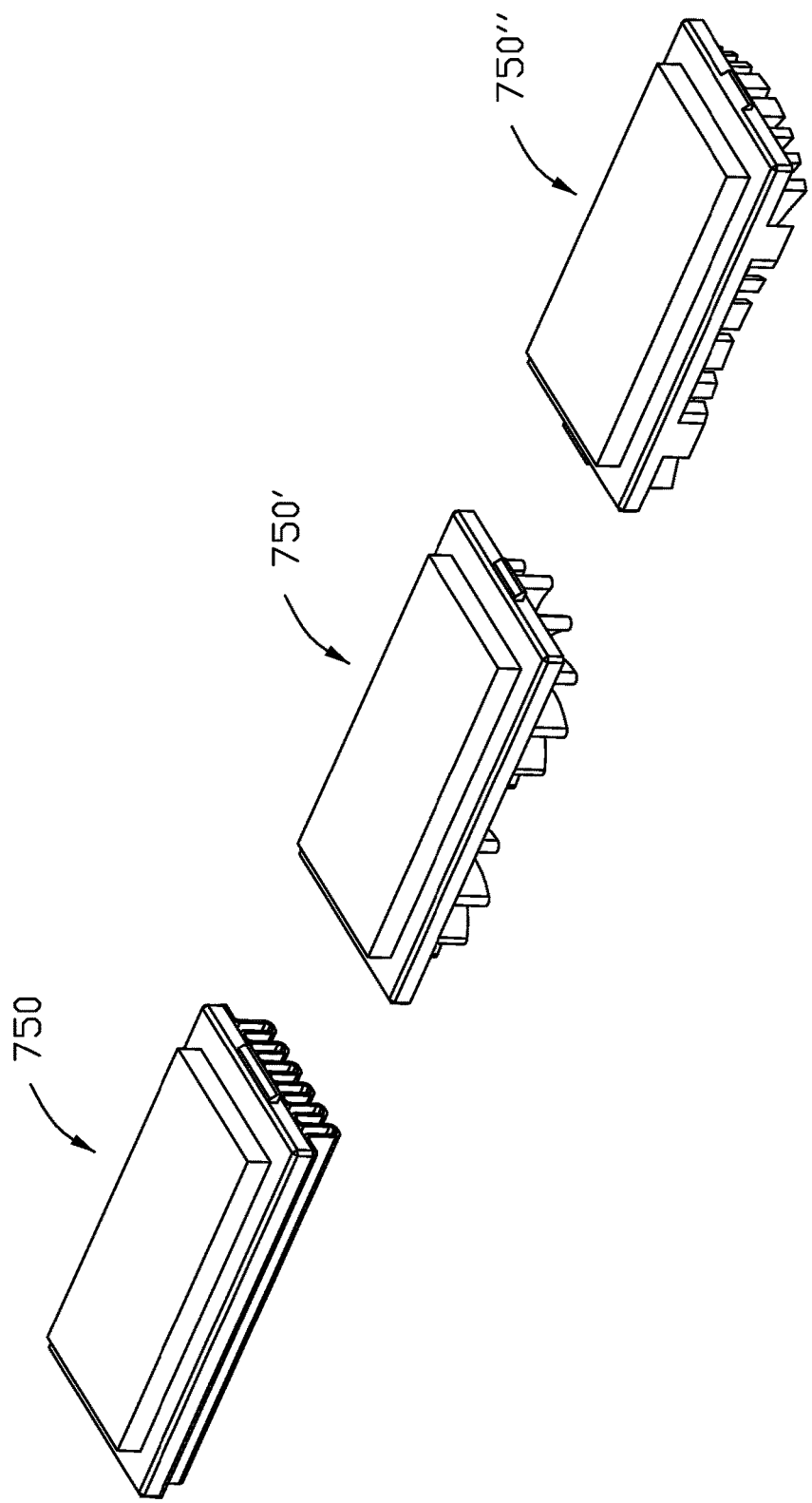
FIG. 31(B) is a downward perspective view of the three different type heat sink members adapted to be used with the plug connector of FIG. 25.
Figure 32A:
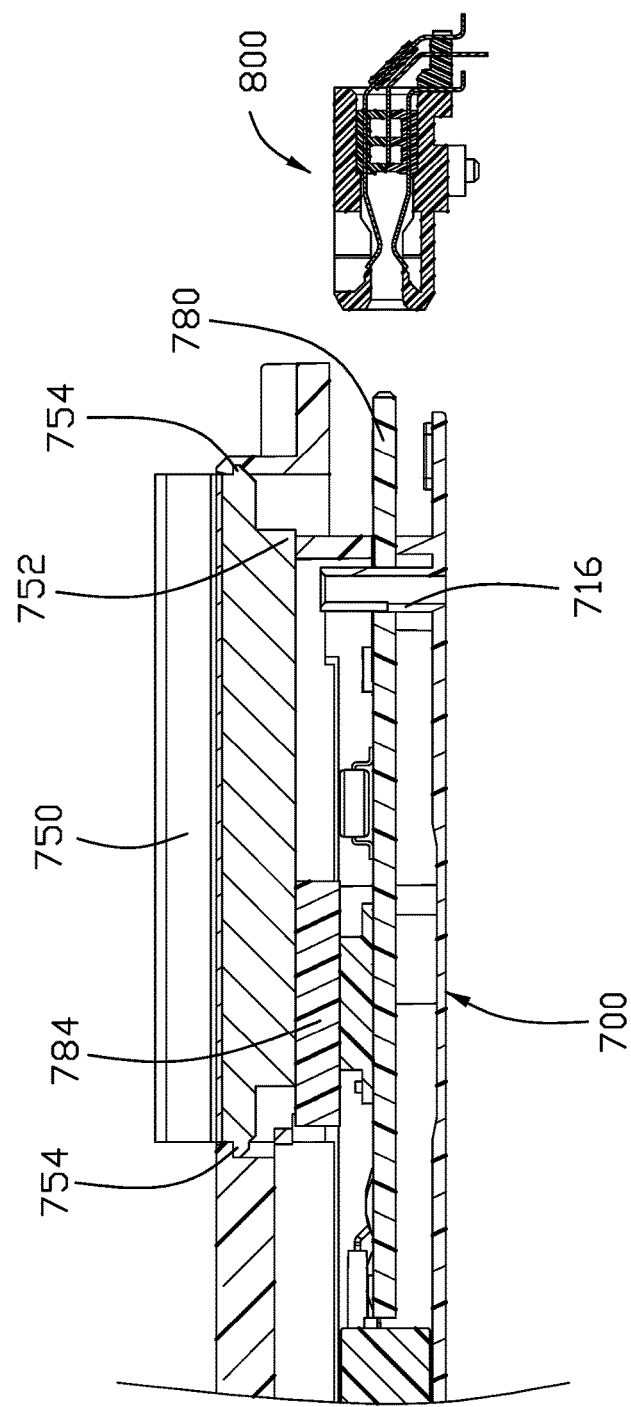
FIG. 32(A) is a cross-sectional view of the receptacle connector and the partial plug connector of FIG. 24(A) along a center line of the plug connector.
Figure 32B:
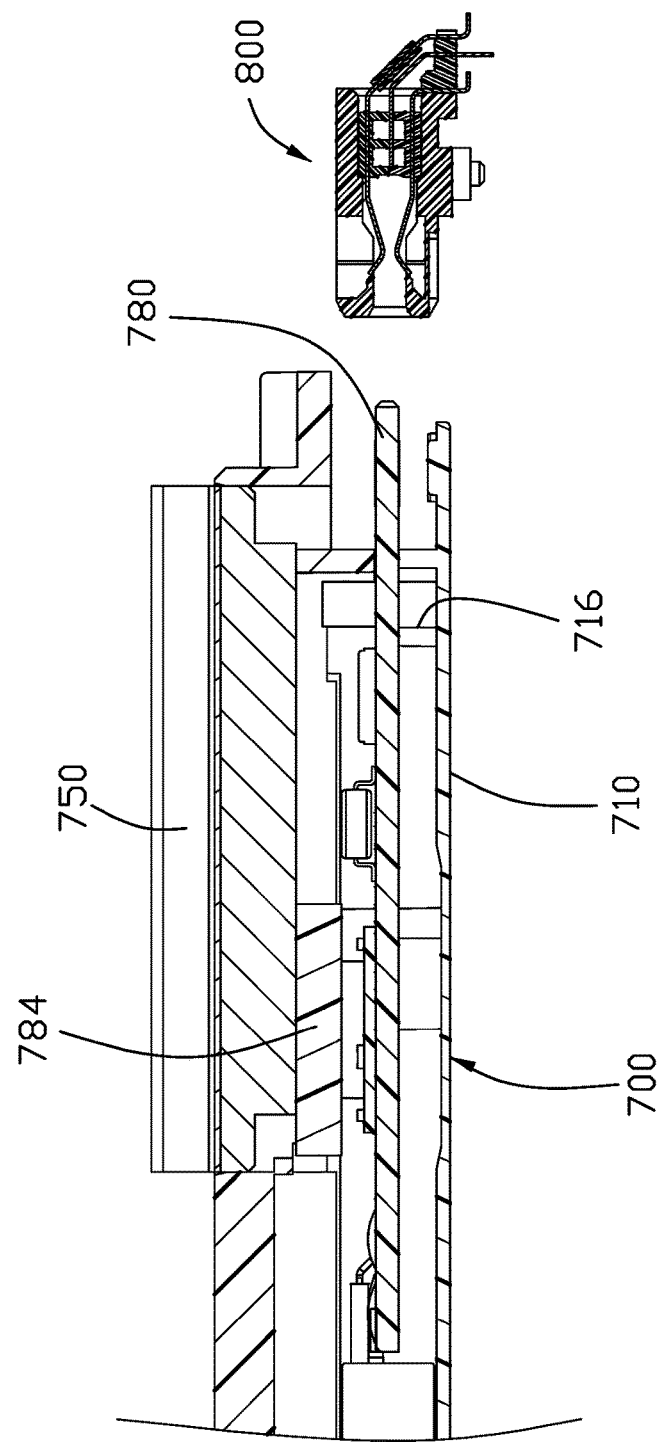
FIG. 32(B) is a cross-sectional view of the receptacle connector and the partial plug connector of FIG. 24(A) along a line offset from a center line of the plug connector.

In this embodiment, the heat sink member 750 is detachably attached to the metallic enclosure 710 in a rotational manner wherein the heat sink member 750 includes the latching structure 754 and the metallic enclosure 710 includes the recess structure 713. Notably, the drawings shown in this embodiment in 24(A)-32(B), does not completely show the detailed structure regarding the interengagement structures about the heat sink member 750 and the metallic enclosure 710. Understandably, it may require some deformable/deflectable/removable structures thereabouts for performing removability thereof. In addition, FIGS. 31(A) and 31(B) show different three type heat sink members 750, 750', 750" adapted to be used within the instant invention.

Figure 33A:
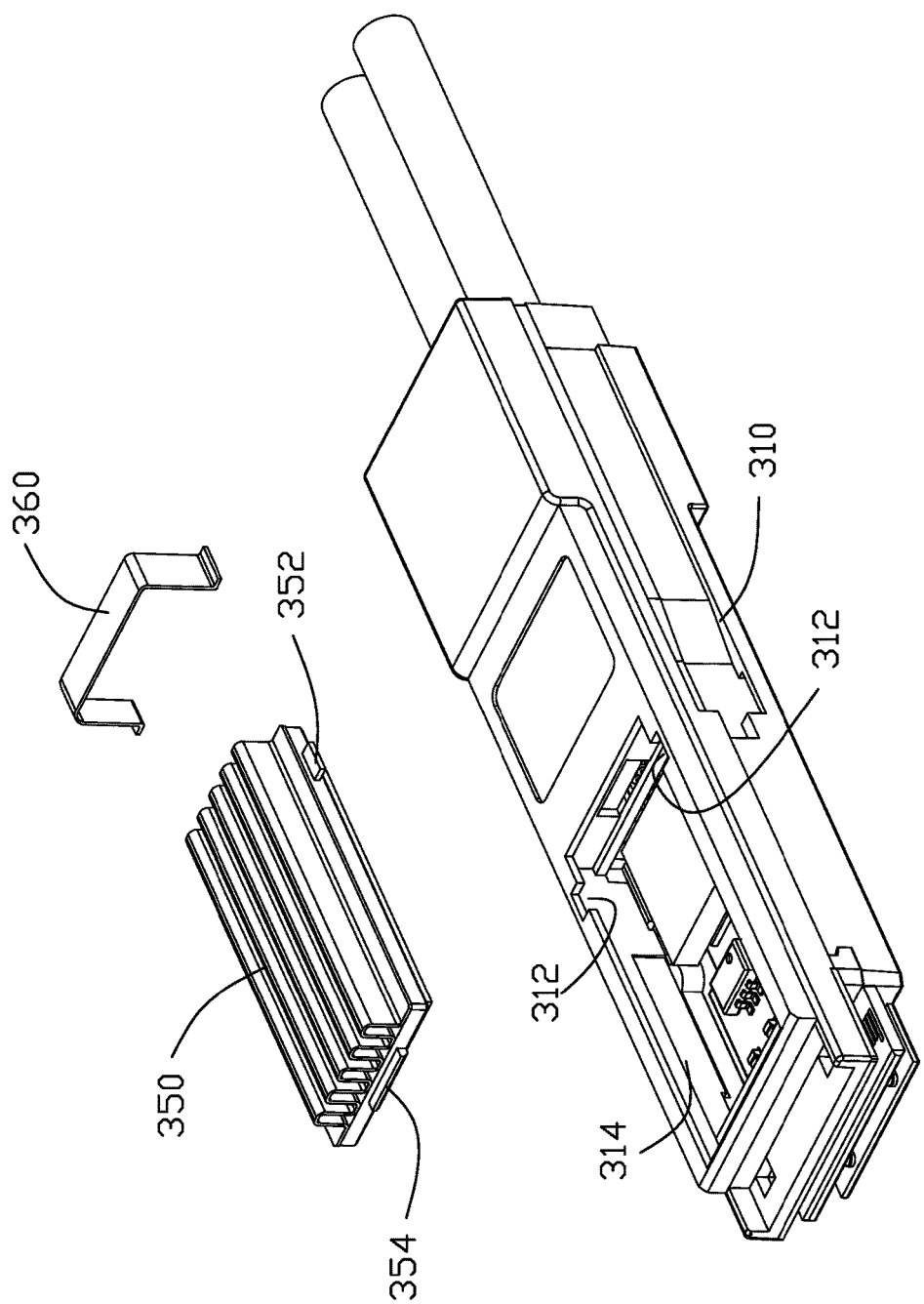
FIG. 33(A) is a perspective view of the plug connector of a fifth embodiment to show the heat sink member removed from the enclosure.
Figure 33B:
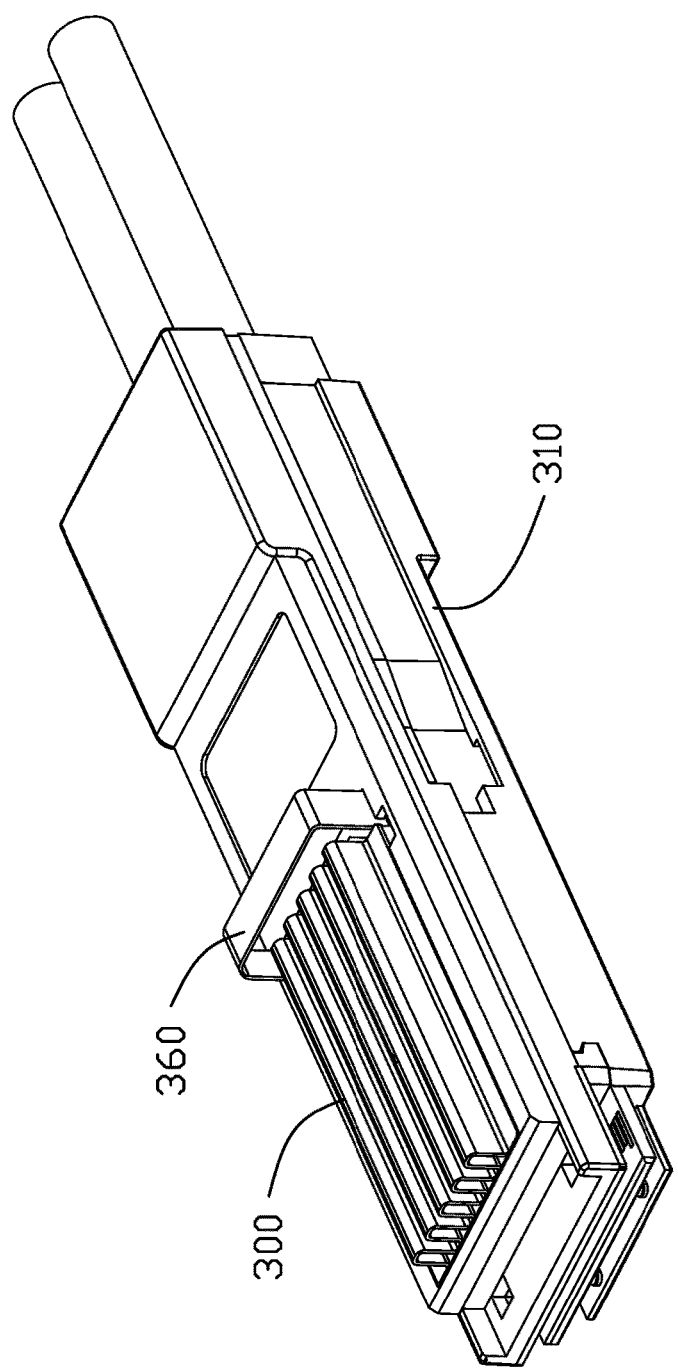
FIG. 33(B) is a perspective view of the plug connector of FIG. 33(A) to show the heat sink member assembled to the enclosure.

Alternately, a fifth embodiment of the plug connector 300 in accordance with present invention shown in FIGS. 33(A) and 33(B) discloses the heat sink member 350 equipped with a pair of locking ears 352 and a latch 354 to be downwardly assembled into the opening 314 of the 310 firstly wherein the locking ears 352 are aligned with the corresponding cutouts 312 in the metallic enclosure 310, and successively to be moved forwardly so as to have the locking ears 352 and the latch 354 engaged with an underside of the top wall of the metallic enclosure 310. Finally, a stuffer/blocker 360 is inserted into the remaining portion of the opening 314 behind the heat sink member 350 for preventing backward movement of the heat sink member 350. To replace the heat sink member 350, two arms of the blocker 360 are inwardly deflected to each other to disengage the blocker 360 from the metallic enclosure 310, and moved upwardly so as to allow the heat sink member 350 to be withdrawn initially backwardly/horizontally and successively upwardly/vertically.

Figure 34A:
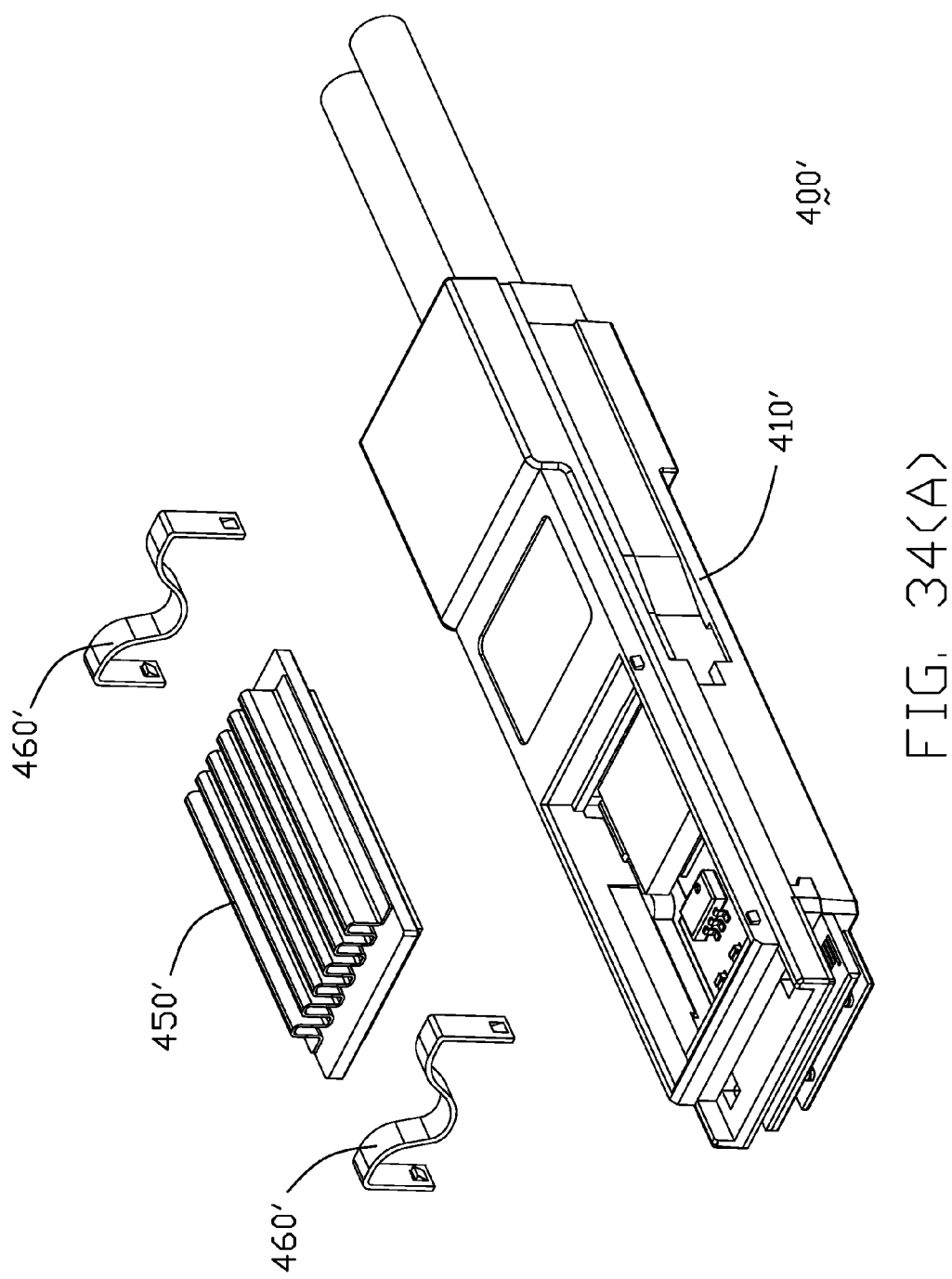
FIG. 34(A) is a perspective view of the plug connector of a sixth embodiment to show the heat sink member removed from the enclosure.
Figure 34B:
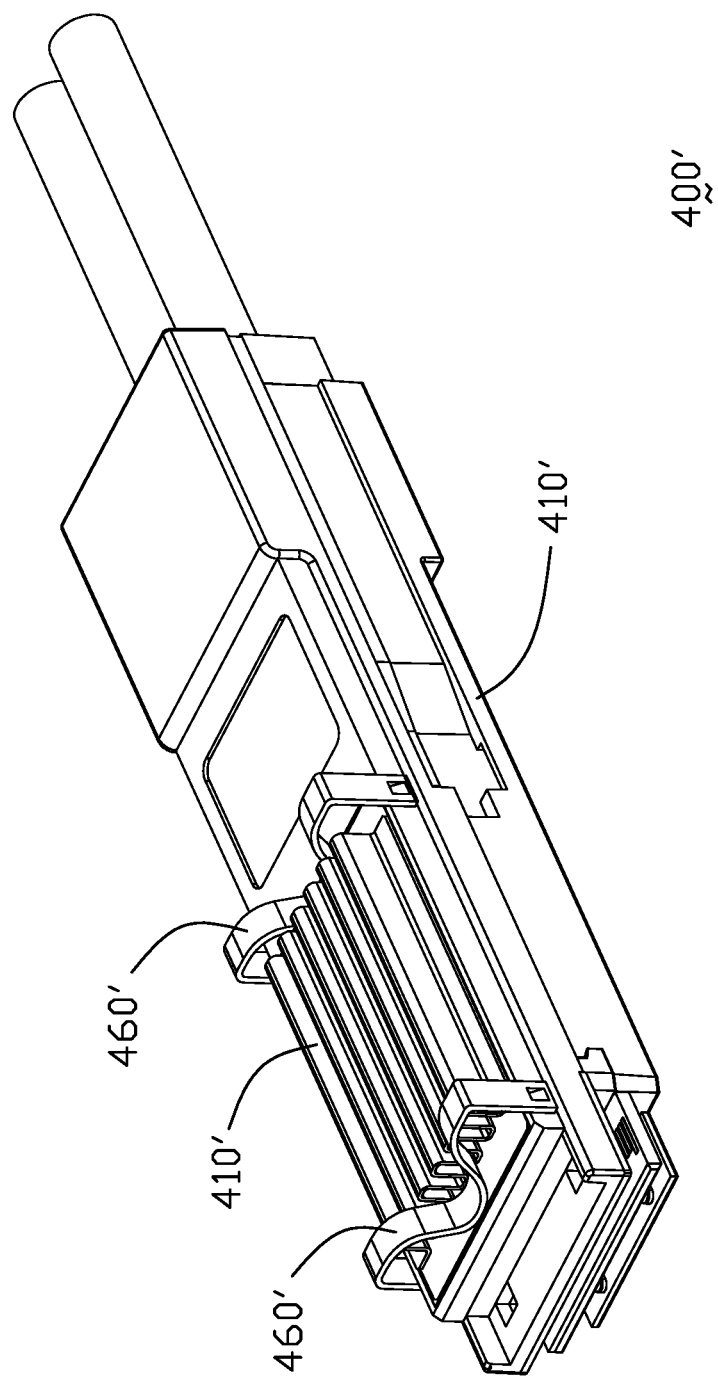
FIG. 34(B) is a perspective view of the plug connector of FIG. 34(A) to show the heat sink member assembled to the enclosure.
Figure 35:
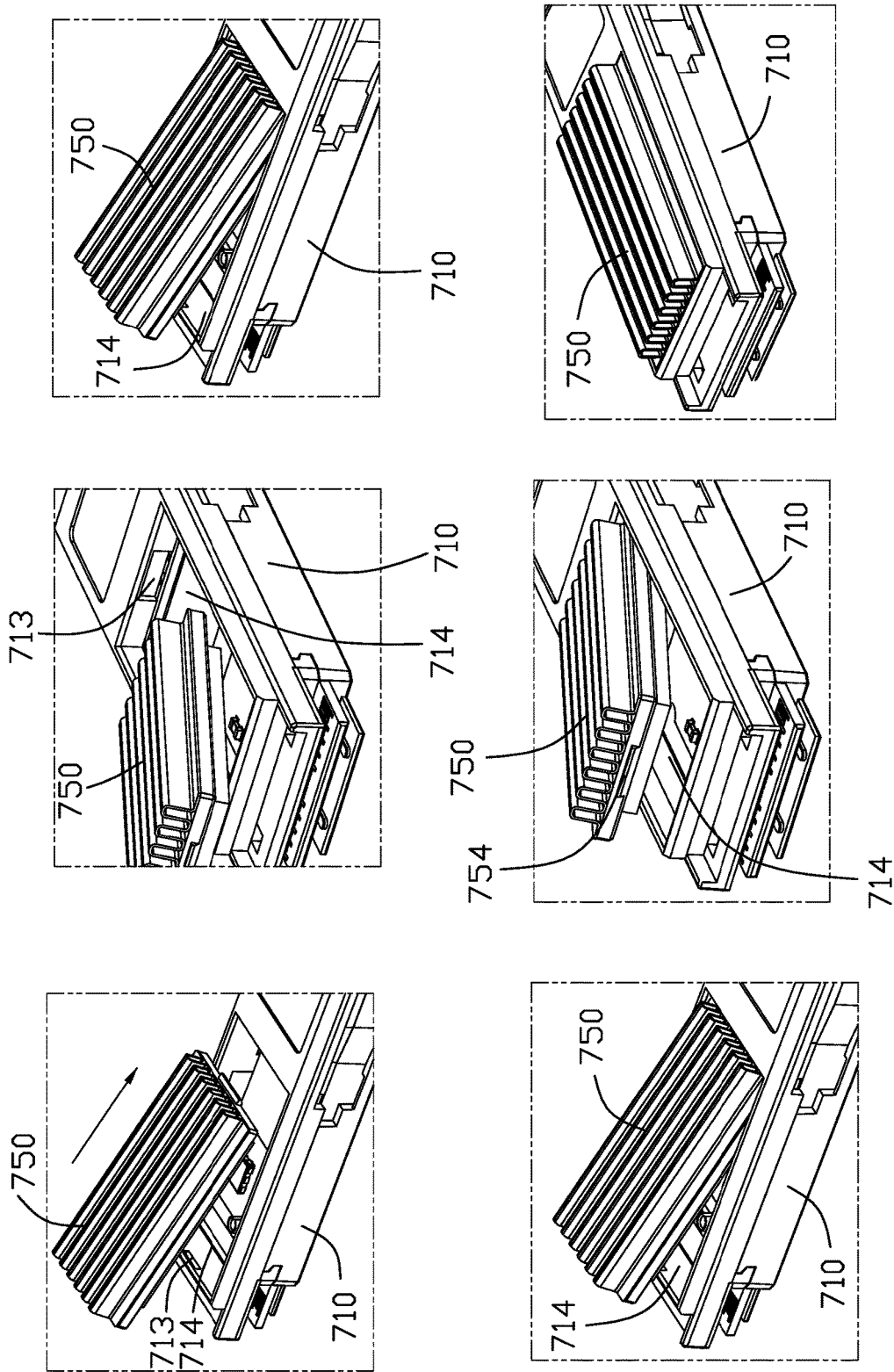
FIG. 35 shows assembly steps of the heat sink mounted to the plug connector of FIG. 28(A).

Alternately, a sixth embodiment of the plug connector 400' in accordance with present invention shown in FIGS. 34(A) and 34(B), the heat sink member 450' can be locked to the metallic enclosure 410' by a pair of clips 460' wherein the clip 460' may be locked to the exterior surface of the metallic enclosure 410' or to the cage (not shown) on the mother board (not shown) as long as the cage forms a proper opening to allow the heat sink member 450' to extend upwardly after the plug connector 400' is assembled into the cage along the horizontal direction. The clips 460' are attached to the metallic enclosure 410' to downwardly press and hold the heat sink member 450' in position. Notably, such an M-shaped clip 460' may be equipped with stamped-out upwardly extending operation portions to totally form a H-shaped configuration for easy operation in a lever manner as shown in U.S. Pat. No. 6,634,891.

What is claimed is:

1. A plug connector comprising:
   a metallic enclosure with a heat sink member exposed on an exterior surface of the metallic enclosure, the metallic enclosure enclosing a printed circuit board;
   a set of electronic components assembled upon the printed circuit board; and
   a thermal pad sandwiched between the set of electronic components and the metallic enclosure to dissipate heat from at least one of the electronic components to the heat sink member of the metallic enclosure; wherein
   a center of said heat sink member is essentially aligned with a center of said set of electronic components or a center of the thermal pad for efficient dissipation of the heat;
   the heat sink member comprises a first heat sink and a second heat sink commonly located above the thermal pad; and
   the first heat sink comprises a pair of center fins surrounded by a plurality of peripheral fins each being curved in a radial direction, said peripheral fins divided into two groups in a lengthwise direction of said plug connector wherein one of the two groups proximate to the second heat sink includes one additional fin along a centerline of the plug connector extending along the lengthwise direction compared with another group distal from the second heat sink.

2. The plug connector as claimed in claim 1, wherein the second heat sink comprises a three primary fins arranged in a triangular manner, and two groups of secondary fins located by two sides of one of the primary fins that is located in the centerline of the plug connector.

3. The plug connector as claimed in claim 1, wherein the printed circuit board comprises a plurality of electrical pads formed on a front region of the printed circuit board, and an attachment connection unit having a plurality of contacts respectively soldered upon corresponding ones of the electrical pads and an insulative housing enclosing the contacts and the front region of the printed circuit board via an insert-molding process, said attachment connection unit being located at a front opening of the metallic enclosure to be exposed toward an exterior of the plug connector.

4. The plug connector as claimed in claim 1, wherein the metallic enclosure is formed by a die-casting process.

5. A plug connector comprising:
a metallic enclosure with a heat sink member exposed on an exterior surface of the metallic enclosure, the metallic enclosure enclosing a printed circuit board;
a set of electronic components assembled upon the printed circuit board; and
a thermal pad sandwiched between the set of electronic components and the metallic enclosure to dissipate heat from at least one of the electronic components to the heat sink member of the metallic enclosure; wherein
a center of said heat sink member is essentially aligned with a center of said set of electronic components or a center of the thermal pad for efficient dissipation of the heat;
the heat sink member comprises a first heat sink and a second heat sink commonly located above the thermal pad; and
the second heat sink comprises three primary fins arranged in a triangular manner, and two groups of secondary fins located by two sides of one of the primary fins that is located in a centerline of the plug connector extending along a lengthwise direction of the plug connector.

6. The plug connector as claimed in claim 5, wherein the printed circuit board comprises a plurality of electrical pads formed on a front region of the printed circuit board, and an attachment connection unit having a plurality of contacts respectively soldered upon corresponding ones of the electrical pads and an insulative housing enclosing the contacts and the front region of the printed circuit board via an insert-molding process, said attachment connection unit being located at a front opening of the metallic enclosure to be exposed toward an exterior of the plug connector.

7. The plug connector as claimed in claim 5, wherein the metallic enclosure is formed by a die-casting process.

* * * * *